(12) United States Patent
Park et al.

(10) Patent No.: US 9,754,936 B2
(45) Date of Patent: Sep. 5, 2017

(54) SEMICONDUCTOR DEVICE AND METHOD OF FABRICATING THE SAME

(71) Applicants: Suehye Park, Seoul (KR); Yoonhae Kim, Suwon-Si (KR); Deokhan Bae, Hwaseong-Si (KR); Jaeran Jang, Suwon-Si (KR); Hwichan Jun, Yongin-Si (KR)

(72) Inventors: Suehye Park, Seoul (KR); Yoonhae Kim, Suwon-Si (KR); Deokhan Bae, Hwaseong-Si (KR); Jaeran Jang, Suwon-Si (KR); Hwichan Jun, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/995,830

(22) Filed: Jan. 14, 2016

(65) Prior Publication Data
US 2016/0307837 A1    Oct. 20, 2016

(30) Foreign Application Priority Data
Apr. 14, 2015    (KR) .................. 10-2015-0052551

(51) Int. Cl.
*H01L 27/088*    (2006.01)
*H01L 23/485*    (2006.01)

(52) U.S. Cl.
CPC .......... *H01L 27/088* (2013.01); *H01L 23/485* (2013.01)

(58) Field of Classification Search
None
See application file for complete search history.

(56) References Cited

U.S. PATENT DOCUMENTS

| | | |
|---|---|---|
| 7,221,023 B2 | 5/2007 | Seo et al. |
| 7,868,386 B2 | 1/2011 | Thei et al. |
| 8,067,804 B2 | 11/2011 | Maegawa et al. |
| 8,101,479 B2 | 1/2012 | Parker et al. |
| 8,637,371 B2 | 1/2014 | Chang et al. |
| 8,823,064 B2 | 9/2014 | Chang et al. |
| 8,999,786 B1 * | 4/2015 | Wu ............. H01L 21/027 257/315 |
| 2006/0292719 A1 | 12/2006 | Lochtefeld et al. |

(Continued)

FOREIGN PATENT DOCUMENTS

| | | |
|---|---|---|
| JP | 2012-522368 A | 9/2012 |
| JP | 5172083 B2 | 1/2013 |

(Continued)

*Primary Examiner* — Charles Garber
*Assistant Examiner* — Alia Sabur
(74) *Attorney, Agent, or Firm* — Volentine & Whitt, PLLC

(57) ABSTRACT

A semiconductor device includes a substrate provided with active patterns, gate electrodes extending across the active patterns, source/drain regions provided in upper portions of the active patterns between the gate electrodes, respectively, and first contacts and second contacts provided between the gate electrodes and electrically connected to the source/drain regions, respectively. The first and second contacts are disposed in such a way that a contact center line thereof is spaced apart from a corresponding gate center line by first and second distances. The first distance differs from the second distance.

19 Claims, 39 Drawing Sheets

(56) References Cited

U.S. PATENT DOCUMENTS

| | | | |
|---|---|---|---|
| 2008/0109770 A1* | 5/2008 | Kim | G06F 17/5068 |
| | | | 716/122 |
| 2009/0321841 A1 | 12/2009 | Hoentschel et al. | |
| 2013/0026572 A1* | 1/2013 | Kawa | H01L 27/0207 |
| | | | 257/347 |
| 2014/0065782 A1* | 3/2014 | Lu | H01L 29/785 |
| | | | 438/294 |
| 2014/0252477 A1* | 9/2014 | Tseng | H01L 29/66795 |
| | | | 257/347 |
| 2014/0264440 A1 | 9/2014 | Chen et al. | |
| 2014/0346605 A1* | 11/2014 | Zeitzoff | H01L 27/0886 |
| | | | 257/368 |
| 2016/0056155 A1* | 2/2016 | Park | H01L 29/0847 |
| | | | 257/401 |
| 2016/0087053 A1* | 3/2016 | Kim | H01L 29/41783 |
| | | | 257/369 |
| 2016/0118496 A1* | 4/2016 | Anderson | H01L 29/66484 |
| | | | 257/365 |
| 2016/0163850 A1* | 6/2016 | Liu | H01L 29/785 |
| | | | 257/338 |

FOREIGN PATENT DOCUMENTS

| | | |
|---|---|---|
| KR | 10-0549005 B1 | 1/2006 |
| KR | 10-2006-0062490 A | 6/2006 |
| KR | 10-0905168 B1 | 6/2009 |
| KR | 10-2011-0038652 A | 4/2011 |
| KR | 10-1225816 B1 | 1/2013 |

* cited by examiner

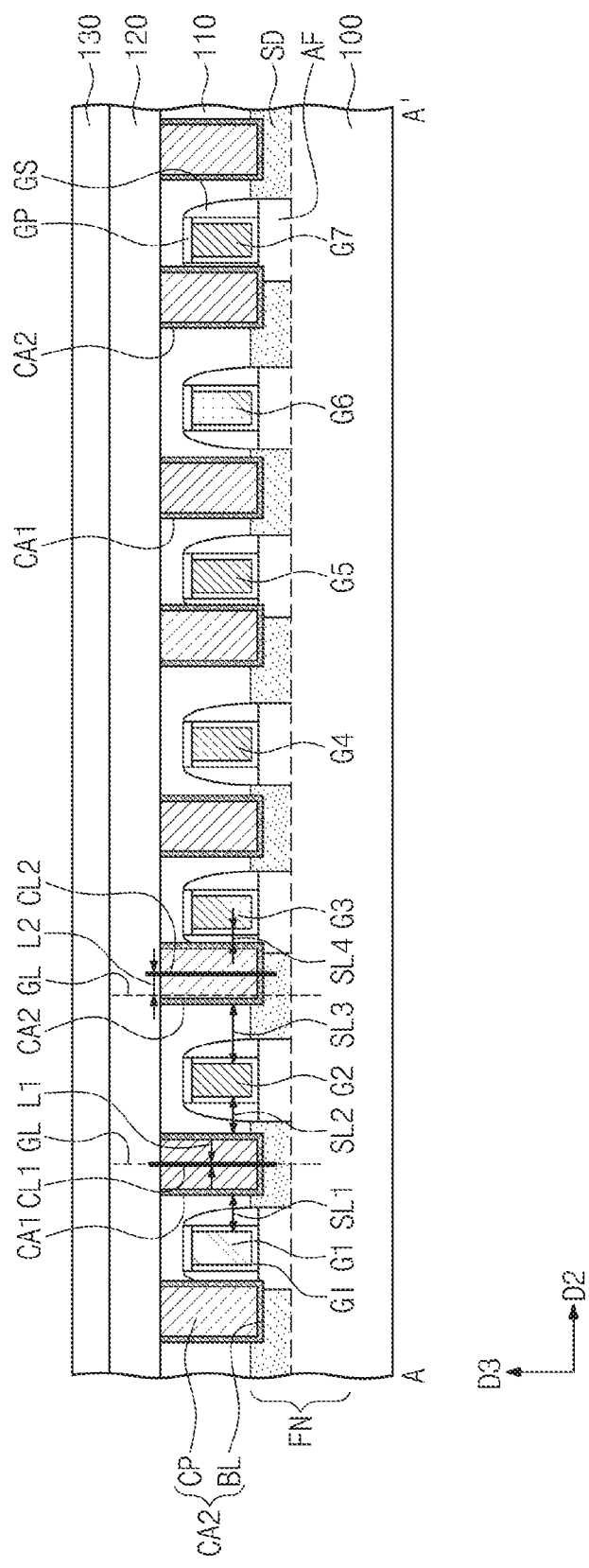

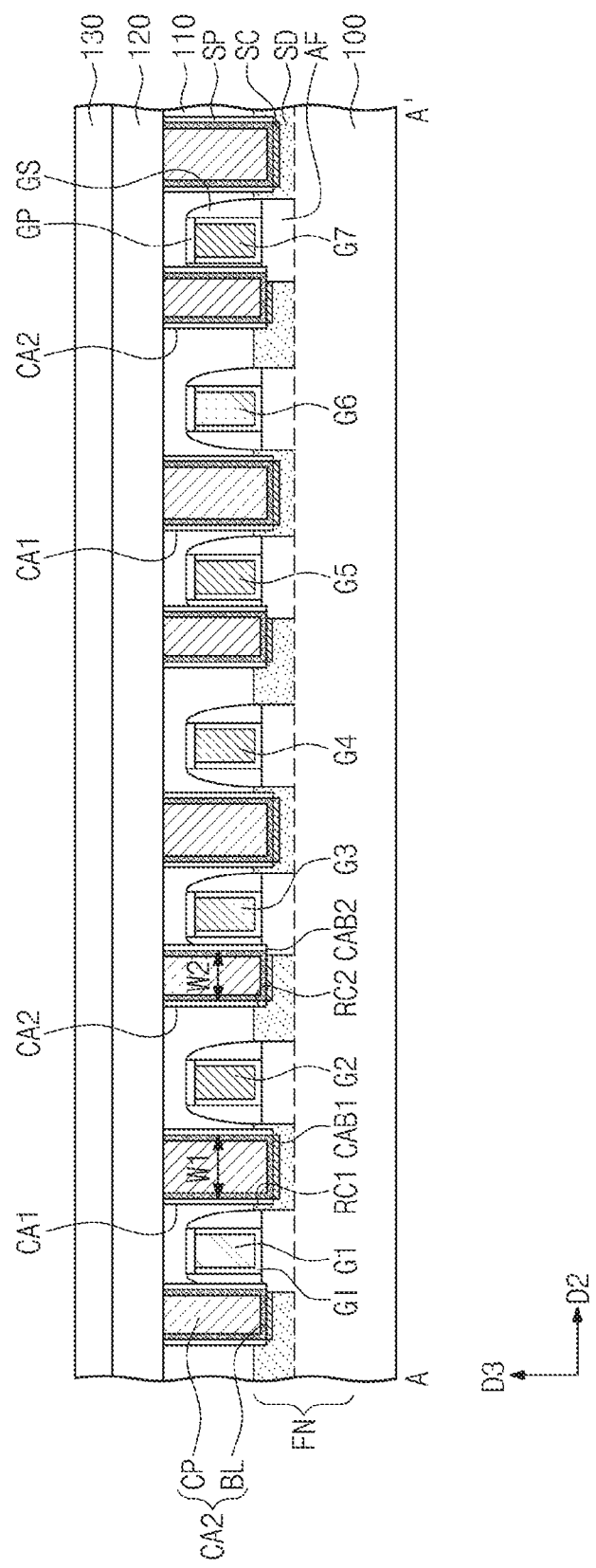

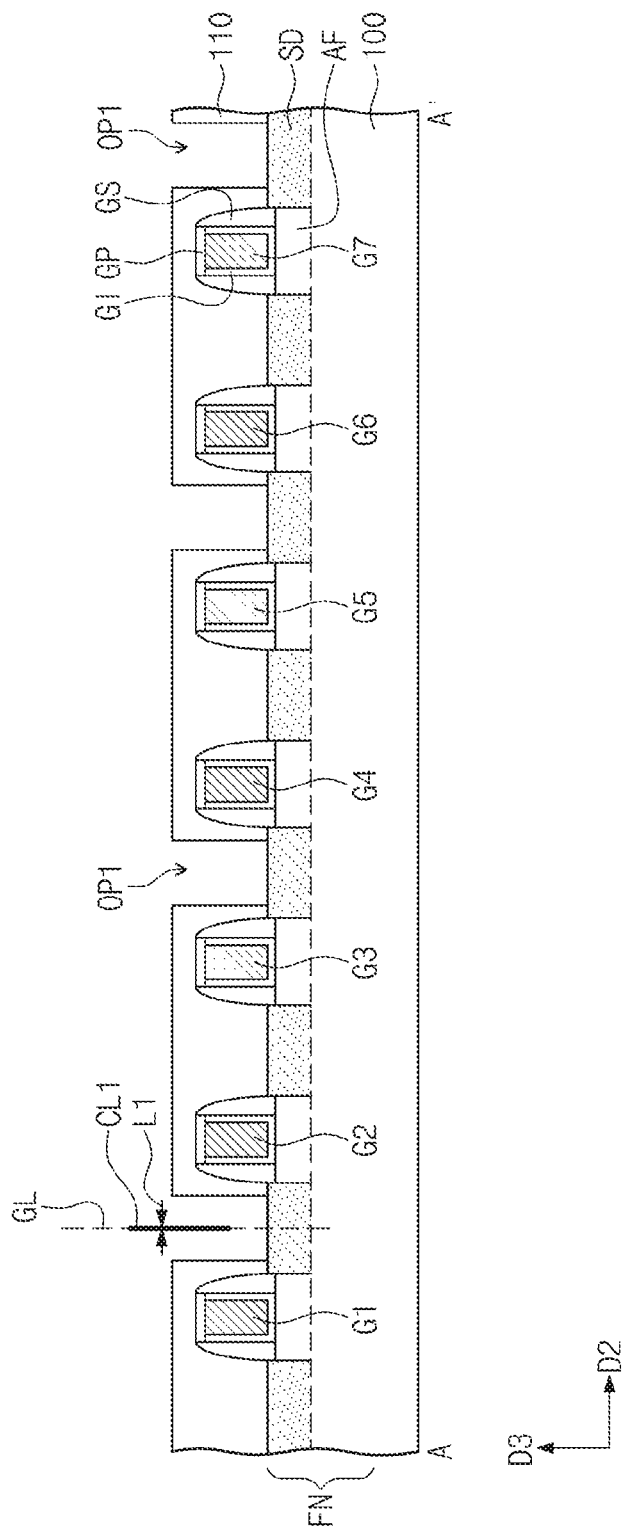

SEMICONDUCTOR DEVICE AND METHOD OF FABRICATING THE SAME

PRIORITY STATEMENT

This U.S. non-provisional patent application claims priority under 35 U.S.C. §119 to Korean Patent Application No. 10-2015-0052551, filed on Apr. 14, 2015, in the Korean Intellectual Property Office, the entire contents of which are hereby incorporated by reference.

BACKGROUND

The inventive concept relates to a semiconductor device and to a method of fabricating the same. In particular, the inventive concept relates to semiconductor devices having field effect transistors and vertical contacts electrically connected to source/drain regions of the transistors and to the fabricating of the same.

Due to their small-sized, multifunctional, and/or low-cost characteristics, semiconductor devices are esteemed elements in the electronic industry. Semiconductor devices may be classified as memory devices for storing data, logic devices for processing data, and hybrid devices including both memory and logic elements. Semiconductor devices with improved reliability, performance, and/or increased number of functions are being required to meet an increased demand for electronic devices capable of operating at higher speeds and/or consuming lower amounts of power. To satisfy these demands, the complexity and/or integration density of semiconductor devices is/are being increased. As a result, gate electrodes of transistors of the devices, as well as the source/drain regions of the transistors are being spaced closer and closer together. This reduces the margin by which contacts for the source/drain regions can be formed.

SUMMARY

According to the inventive concept, there is provided a semiconductor device that may include a substrate having active patterns and source/drain regions in upper portions of the active patterns, gate electrodes extending longitudinally in a first direction parallel to a top surface of the substrate and crossing the active patterns, and first contacts and second contacts electrically connected to the source/drain regions, respectively, and in which the gate electrodes are spaced from each other in a second direction parallel to the top surface of the substrate and perpendicular to the first direction, the source/drain regions are located between the gate electrodes as viewed in plan, each of the first and second contacts is interposed between adjacent ones of the gate electrodes in the second direction, and each of the first and second contacts has a contact center line spaced from a gate center line by a first distance different from a second distance by which each of the first contacts is spaced from a gate center line midway between the adjacent ones of the gate electrodes between which the first contact is disposed.

According to the inventive concept, there is also provided a semiconductor device that may include a substrate having an active pattern and source/drain regions in upper portions of the active pattern, gate electrodes extending longitudinally in a first direction parallel to a top surface of the substrate, crossing the active pattern, and spaced from each other in a second direction parallel to the top surface of the substrate and perpendicular to the first direction with the source/drain regions being located between the gate electrodes as viewed in plan, and first contacts and second contacts electrically connected to the source/drain regions, respectively, and spaced apart in the second direction, and in which each of the first contacts is spaced from adjacent ones of a respective pair of the gate electrodes by a first separation distance and a second separation distance, respectively, each of the second contacts is spaced from adjacent ones of a respective pair of the gate electrodes by a third separation distance and a fourth separation distance, respectively, and the ratio of the first separation distance to the second separation distance is different from the ratio of the third separation distance to the fourth separation distance.

According to the inventive concept, there is also provided a semiconductor device that may include a substrate having an active pattern and source/drain regions in upper portions of the active pattern, gate electrodes extending longitudinally in a first direction parallel to a top surface of the substrate and crossing the active pattern, at least one first contact and a set of second contacts, each of the contacts being electrically connected to a respective one of the source/drain regions, and in which the gate electrodes are uniformly spaced from each other in a second direction parallel to the top surface of the substrate and perpendicular to the first direction, the source/drain regions are interposed between the gate electrodes as viewed in plan, each said at least one of the first contacts is interposed between adjacent gate electrodes of a respective pair of the gate electrodes, each of the second contacts is interposed between adjacent gate electrodes of a respective pair of the gate electrodes, and the set of second contacts are offset in the second direction relative the gate electrodes by an amount different from that by which the at least one first contact is offset relative to the gate electrodes in the second direction.

According to the inventive concept, there is provided a method of fabricating a semiconductor device that may include forming gate electrodes on a substrate to extend in a first direction parallel to a top surface of the substrate, forming an interlayer insulating layer to cover the gate electrodes, forming first contact holes and second contact holes to penetrate the interlayer insulating layer and be arranged in a second direction crossing the first direction, each of the first and second contact holes being positioned between the gate electrodes, when viewed in a plan view, and forming first and second contacts in the first and second contact holes, respectively. Each of the first contact holes may be formed in such a way that a contact center line thereof is spaced apart from a gate center line corresponding therewith, by a first distance, and each of the second contact holes may be formed in such a way that a contact center line thereof is spaced apart from a gate center line corresponding therewith, by a second distance. The first distance may be different from the second distance, and the second contact holes may be formed using a photomask different from that for forming the first contact holes.

BRIEF DESCRIPTION OF THE DRAWINGS

The inventive concept will be more clearly understood from the following brief description of examples thereof taken in conjunction with the accompanying drawings. The accompanying drawings represent non-limiting, examples of the inventive concept.

FIGS. 3A, 3B, and 3C are sectional views taken along lines A-A', B-B', and C-C', respectively, of FIG. 2.

FIG. 3D is a sectional view taken along line A-A' of FIG. 2 to illustrate another example of a semiconductor device according to the inventive concept.

FIGS. 5A, 7A, and 9A are sectional views taken along lines A-A' of FIGS. 4, 6, and 8, respectively.

Figure 1:
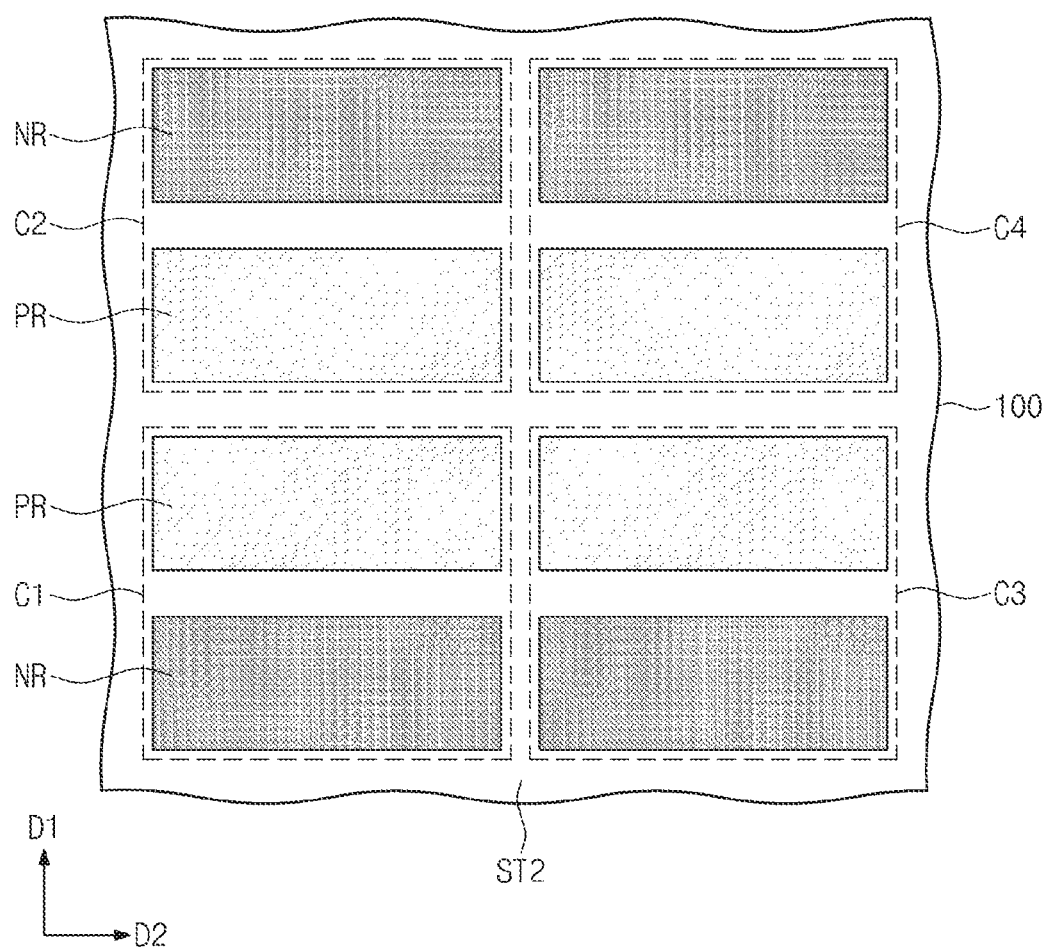
FIG. 1 is a plan view schematically illustrating examples of a semiconductor device according to the inventive concept.

It should be noted that these figures are intended to supplement the written description provided below by illustrating the general characteristics of methods, structure and/or materials utilized in certain examples of the inventive concept. These drawings are not, however, to scale and may not precisely reflect the precise structural or performance characteristics of any given example, and should not be interpreted as defining or limiting the range of values or properties encompassed by the examples. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Examples of the inventive concept will now be described more fully with reference to the accompanying drawings. The inventive concept may, however, be exemplified in many different forms and should not be construed as being limited to the examples set forth herein; rather, these examples are provided so that this disclosure will be thorough and complete, and will fully convey the inventive concept to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the corresponding listed items. Other words used to describe the relationship between elements or layers should be interpreted in a like fashion (e.g., "between" versus "directly between," "adjacent" versus "directly adjacent," on versus "directly on"). However, when like elements (e.g., gate electrodes) are referred to as being "adjacent", such a term describes a relationship in which no other like element (e.g., gate electrode) is disposed between the "adjacent" elements (the adjacent gate electrodes).

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples only and is not intended to be limiting of the inventive concept. As used herein, the singular forms "a," "an" and the are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

The term "extending" will generally equate to the lengthwise or longitudinal direction of an element or feature, even if not explicitly stated, especially in the case of elements or features that have a linear form. The term "dummy" as will be understood in the art will refer to a feature that has generally the same form as an element constituting circuitry of the device but which is effectively electrically isolated in the device so as to be inactive during all phases of operation of the device.

Examples of the inventive concept (and intermediate structures of the examples) are described herein with reference to cross-sectional illustrations that are idealized. As such, variations from the shapes of the illustrations as a result, for example, of manufacturing techniques and/or tolerances, are to be expected. Thus, the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

As may be appreciated by those skilled in the art, the various examples of devices and methods of forming devices described herein are applicable to the microelectronic architecture of integrated circuits, in which a plurality of the devices are integrated. Accordingly, the cross-sectional view(s) illustrated herein may be replicated in two different directions, which need not be orthogonal, in the microelectronic architecture. Thus, a plan view of the microelectronic architecture that includes devices according to the inventive concept may include a plurality of the devices in a two-dimensional pattern, i.e., in an array, that is based on the functionality of the electronic device employing the microelectronic architecture.

The devices according to the inventive concept may be interspersed among other devices depending on the functionality of the electronic device. Moreover, in the microelectronic architecture devices according to the inventive concept may be replicated in a third direction orthogonal to two different directions in which the devices are arrayed, to provide three-dimensional integrated circuits.

Accordingly, the cross-sectional view(s) illustrated herein provide support for a plurality of devices arrayed in two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which the inventive concept belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view schematically illustrating examples of a semiconductor device according to the inventive concept.

Referring to FIG. 1, the semiconductor device may include a plurality of logic cells C1, C2, C3, and C4 provided on a substrate. Each of the logic cells C1, C2, C3, and C4 may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 crossing the first direction D1, and a fourth logic cell C4 spaced apart from the second logic cell C2 in the second direction D2. Each of the logic cells C1, C2, C3, and C4 may include active regions or "patterns" spaced apart from each other by a first device isolation layer ST1. Each of the logic cells C1, C2, C3, and C4 may include a PMOSFET region PR and an NMOSFET region NR which are spaced apart from each other by second device isolation layer ST2.

As an example, the PMOSFET and NMOSFET regions PR and NR may be spaced apart from each other in the first direction D1. The PMOSFET region PR of the first logic cell C1 may be disposed adjacent to the PMOSFET region PR of the second logic cell C2 in the first direction D1. In the following description, a term "logic cell" may refer to a unit circuit configured to perform a single logical operation. Further, the number of the logic cells may be different from that illustrated in the drawing.

Figure 2:
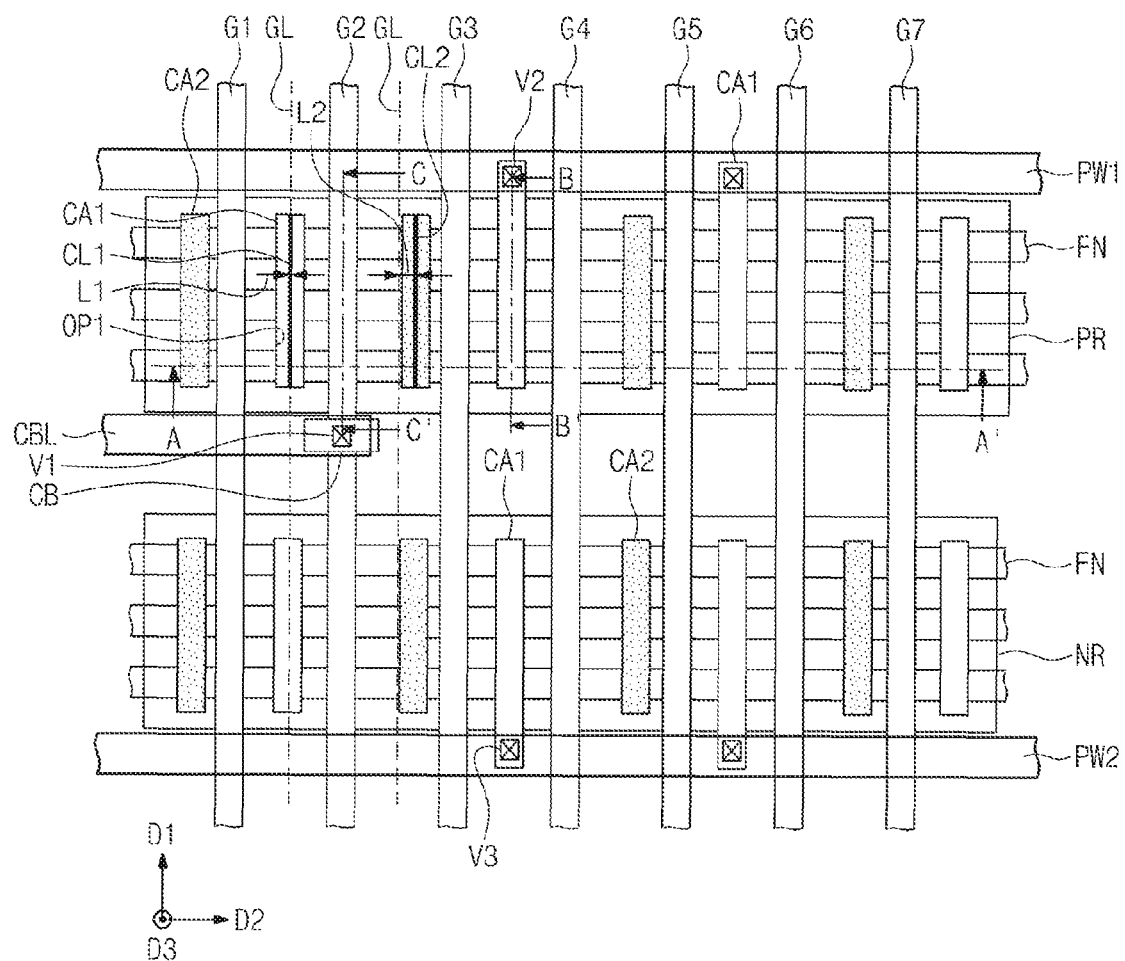
FIG. 2 is a plan view illustrating a portion of examples of a semiconductor device according to the inventive concept.
Figure 3B:
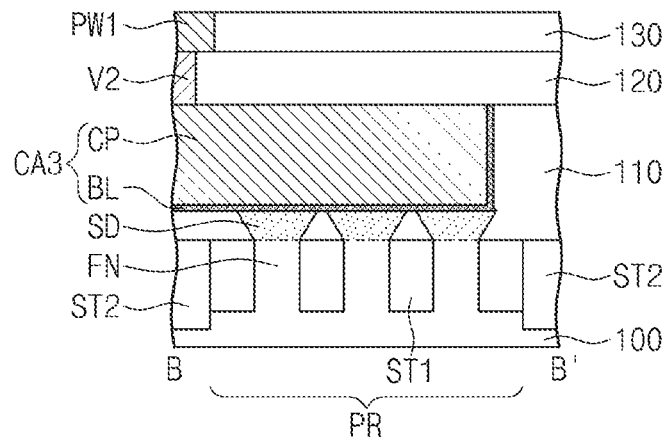
Figure 3C:
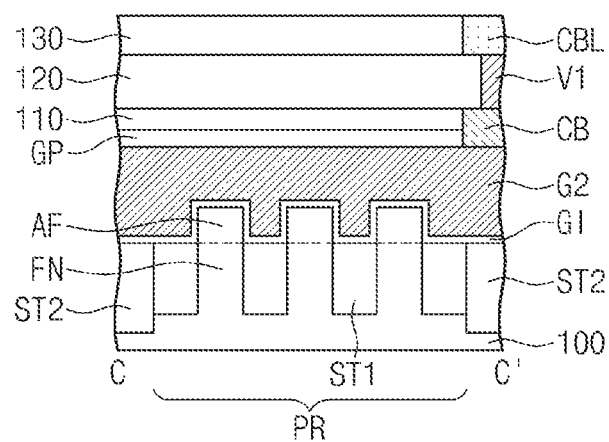

FIG. 2 is a plan view illustrating a portion of a semiconductor device according to the inventive concept. FIGS. 3A, 3B, and 3C are sectional views taken along lines A-N, B-B', and C-C', respectively, of FIG. 2. FIG. 3D is a sectional view taken along line A-A' of FIG. 2 to illustrate another example of a semiconductor device according to the inventive concept. For example, FIG. 2 is a plan view illustrating the first logic cell C1 of FIG. 1. Hereinafter, the inventive concept will be described with reference to the first logic cell C1 of FIG. 1, but the others of the logic cells may have substantially the same or similar structure as that of the first logic cell C1.

Referring to FIGS. 2, 3A, 3B, and 3C, the second device isolation layer ST2 may be provided on a substrate 100 to define the PMOSFET and NMOSFET regions PR and NR. For example, the substrate 100 may be a silicon substrate, a germanium substrate, or a silicon-on-insulator (SOI) substrate. Furthermore, the first logic cell C1 may be isolated from neighboring logic cells C2, C3, and C4 by the second device isolation layer ST2. The second device isolation layer ST2 may be formed in a top portion of the substrate 100.

The PMOSFET and NMOSFET regions PR and NR may be spaced apart from each other, in the first direction D1 parallel to a top surface of the substrate 100, by the second device isolation layer ST2 interposed therebetween. In the illustrated examples, each of the PMOSFET and NMOSFET regions PR and NR is a single region, but it may include a plurality of regions spaced apart from each other by the second device isolation layer ST2.

A plurality of active patterns FN may be provided in the PMOSFET and NMOSFET regions PR and NR to extend in the second direction D2 crossing the first direction D1. The active patterns FN may be arranged along the first direction D1. The first device isolation layer ST1 may be provided at both sides of each of the active patterns FN to extend in the second direction D2. In examples, each of the active patterns FN includes a fin-shaped portion positioned at an upper level thereof. As an example, the fin-shaped portion protrudes in an upward direction between sections of the first device isolation layer ST1.

Although the number of the active patterns FN provided on each of the PMOSFET and NMOSFET regions PR and NR is shown to be three, the inventive concept is not be limited thereto. The first device isolation layer ST1 may be connected to the second device isolation layer ST2 to form a single contiguous insulating layer. In certain examples, the second device isolation layer ST2 has a thickness greater than that of the first device isolation layer ST1. In this case, the first device isolation layer ST1 may be formed by a process different from that for the second device isolation layer ST2. In other examples, the first device isolation layer ST1 is formed by the same process as that for the second device isolation layer ST2, thereby having substantially the same thickness as the second device isolation layer ST2. The first and second device isolation layer ST1 and ST2 may be formed in the upper portion of the substrate 100. The first and second device isolation layer ST1 and ST2 may be formed by a shallow-trench isolation (STI) process and may include, for example, a silicon oxide layer.

Gate electrodes G1-G7 may be provided on the active patterns FN to cross the active patterns FN and extend parallel to the first direction D1. The gate electrodes G1-G7 may be spaced apart from each other in the second direction D2. Each of the gate electrodes G1-G7 may extend parallel to the first direction D1 to cross the PMOSFET region PR, the second device isolation layers ST2, and the NMOSFET region NR.

A gate insulating pattern GI may be provided below each of the gate electrodes G1-G7, and gate spacers GS may be provided at both sides of each of the gate electrodes G1-G7. Furthermore, a capping pattern GP may be provided to cover a top surface of each of the gate electrodes G1-G7. However, in certain examples, the capping pattern GP is removed from a portion of the top surface of the second gate electrode G2 connected to a gate contact CB. First to third interlayer insulating layers 110, 120, and 130 may be provided to cover the gate electrodes G1-G7.

The gate electrodes G1-G7 may include at least one of doped semiconductors, metals, and conductive metal nitrides. The gate insulating pattern GI may include at least one of a silicon oxide layer, a silicon oxynitride layer, and a high-k dielectric layer whose dielectric constant is higher than that of a silicon oxide layer. At least one of the capping pattern GP and the gate spacers GS may include at least one of a silicon oxide layer, a silicon nitride layer, and a silicon oxynitride layer. Each of the first to third interlayer insulating layers 110, 120, and 130 may include a silicon oxide layer or a silicon oxynitride layer.

Source/drain regions SD may be provided in portions of the active patterns FN positioned at both sides of each of the gate electrodes G1-G7. The source/drain regions SD may be locally formed in the active patterns FN, as shown in FIG. 3B, but in certain examples, the source/drain regions SD extend into an upper portion of the substrate 100 (e.g., on the first device isolation layer ST1). The source/drain regions SD in the PMOSFET region PR may be p-type impurity regions, and the source/drain regions SD in the NMOSFET region NR may be n-type impurity regions. The fin-shaped portions, which are positioned below and overlapped with the gate electrodes G1-G7, may serve as channel regions AF of transistors.

The source/drain regions SD may be epitaxial patterns formed by a selective epitaxial growth process. Accordingly, the source/drain regions SD may have top surfaces positioned at a higher level than those of the fin portions. The source/drain regions SD may include a semiconductor element different from that/those of the substrate 100. As an example, the source/drain regions SD are formed of or include a semiconductor material having a lattice constant different from (i.e., greater or smaller than) that of the substrate 100. Accordingly, the source/drain regions SD may exert a compressive stress or a tensile stress on the channel regions AF. As an example, in the case where the substrate 100 is a silicon wafer, the source/drain regions SD of the PMOSFET region PR are formed of or include a silicon-germanium (e-SiGe) or germanium layer. In this case, the source/drain regions SD may exert a compressive stress on the channel regions AF. As another example, in the case where the substrate 100 is a silicon wafer, the source/drain regions SD of the NMOSFET region NR are formed of or include silicon carbide (SiC). In this case, the source/drain regions SD may exert a tensile stress on the channel regions AF. The compressive or tensile stress exerting on the channel regions AF makes it possible to increase mobility of carriers in the channel regions AF, when the transistors are operated.

Although not shown, a metal silicide layer may be provided between the source/drain regions SD and first and second contacts CA1 and CA2 which will be described below. A detailed description thereof will be described with reference to FIG. 3D.

First and second contacts CA1 and CA2 may be provided between the gate electrodes G1-G7. The first and second contacts CA1 and CA2 may be arranged along the active patterns FN and in the second direction D2. As an example, the first contacts CA1 and the second contacts CA2 are alternately and repeatedly arranged in the second direction D2. In FIG. 2, the first and second contacts CA1 and CA2 are differently hatched, for distinction. Also, the first and second contacts CA1 and CA2 may be arranged in the first direction D1 between the gate electrodes G1-G7. As an example, between the first and second gate electrodes G1 and G2, the first contacts CA1 are respectively provided on the PMOSFET and NMOSFET regions PR and NR and may be arranged in the first direction D1. The first and second contacts CA1 and CA2 may be directly coupled to and electrically connected to the source/drain regions SD. The first and second contacts CA1 and CA2 may be provided in the first interlayer insulating layer 110.

In examples, on the PMOSFET region PR, two or more source/drain regions SD, which are spaced apart from each other in the first direction D1 by the first device isolation layer ST1 interposed therebetween, are electrically connected to each other by at least one of the first and second contacts CA1 and CA2. In other words, at least one of the first and second contacts CA1 and CA2 may cover a plurality of the active patterns FN in common and connect a plurality of the source/drain regions SD spaced apart from each other in the first direction D1 (e.g., see FIG. 3B). Here, the first and second contacts CA1 and CA2 may be shaped like a bar extending in the first direction D1.

The source/drain regions SD on the NMOSFET region NR may be connected to each other by the first and second contacts CA1 and CA2, in the same manner as those on the PMOSFET region PR. In other words, on the NMOSFET region NR, two or more source/drain regions SD, which are spaced apart from each other in the first direction D1 by the first device isolation layer ST1, may be connected to each other by the first and second contacts CA1 and CA2.

Although not shown, at least one of the first and second contacts CA1 and CA2 may be extended over the second device isolation layer ST2 to connect the source/drain regions SD of the PMOSFET region PR to the source/drain regions SD of the NMOSFET region NR.

Each of the first and second contacts CA1 and CA2 may include a conductive pillar CP and a barrier layer BL covering side and bottom surfaces of the conductive pillar CP. The conductive pillar CP may be enclosed by the barrier layer BL having a conformal thickness. However, a top surface of the conductive pillar CP may not be covered with the barrier layer BL. The conductive pillar CP may include at least one of doped semiconductors, metals, and conductive metal nitrides. As an example, the conductive pillars CP are formed of or include tungsten, and the barrier layer BL are formed of or include Ti/TiN.

A gate contact CB and a conductive line CBL may be provided on the second gate electrode G2. A first via V1 may be interposed between the gate contact CB and the conductive line CBL. The conductive line CBL may be electrically connected to the second gate electrode G2 through the first via V1 and the gate contact CB to serve as a current path for applying signals to the second gate electrode G2.

The first logic cell C1 may include a first wire PW1 provided near an outer edge of the PMOSFET region PR and a second wire PW2 provided near an outer edge of the NMOSFET region NR. As an example, the first wire PW1 on the PMOSFET region PR serve as a current path for transmitting a drain voltage Vdd (e.g., a power voltage). The second wire PW2 on the NMOSFET region NR may serve as a current path for transmitting a source voltage Vss (e.g., a ground voltage).

Referring back to FIGS. 1 and 2, the first and second wires PW1 and PW2 may extend parallel to the second direction D2 and may be shared by a plurality of logic cells disposed adjacent to each other in the second direction D2. As an example, the first wire PW1 is shared by the first logic cell C1 and the third logic cell C3. Furthermore, the first wire PW1 may be shared by the PMOSFET regions PR of the first and second logic cells C1 and C2.

In examples, a second via V2 is provided on one of the first contacts CA1. Accordingly, the source/drain SD connected to the first contact CA1 may be electrically connected to the first wire PW1 through the first contact CA1 and the second via V2. Similarly, the source/drain SD on the NMOSFET region NR may also be electrically connected to the second wire PW2 through one of the first contacts CA1 and a third via V3.

The first and second contacts CA1 and CA2 on the PMOSFET region PR will be described in more detail below. However, the PMOSFET region PR is an example of the inventive concept, and a relation between the first and second contacts CA1 and CA2 to be described below may be identically applied to those on the NMOSFET region NR.

The first contacts CA1 and the second contacts CA2 may be differently shifted from the gate electrodes G1-G7 adjacent thereto. That is, the extent to which the first contacts CA1 are laterally offset from the gate electrodes adjacent thereto is different from the degree to which the second contacts CA2 are laterally offset from the gate electrodes adjacent thereto.

For example, a gate center line GL may be equidistant from the first and second gate electrodes G1 and G2 to extend parallel to the first direction D1. The gate center line GL refers to an imaginary line. A gate center line GL may also be defined, in the same manner, between the second and third gate electrodes G2 and G3. A first contact center line CL1 may extend along a center axis of the first contact CA1 and parallel to the first direction D1. The first contact center line CL1 may be positioned between the first and second gate electrodes G1 and G2. A second contact center line CL2 may extend along a center axis of the second contact CA2 and parallel to the first direction D1. The second contact center line CL2 may be positioned between the second and third gate electrodes G2 and G3.

In this example, the first contact center line CL1 is spaced apart from the gate center line GL, which is positioned between a corresponding pair (e.g., G1 and G2) of the gate electrodes adjacent thereto, by a first distance L1. In the illustrated example, the first distance L1 is substantially zero, and thus, the first contact CA1 may be normally aligned to be equidistant from the first and second gate electrodes G1 and G2. The second contact center line CL2 is spaced apart from the gate center line GL, which is positioned between a corresponding pair (e.g., G2 and G3) of the gate electrodes adjacent thereto, by a second distance L2. By contrast, the second distance L2 has a positive value, when measured along the second direction D2. In other words, the second contact CA2 may be closer to the third gate electrode G3 than to the second gate electrode G2.

As will be described in more detail below, the first contacts CA1 may be formed at the same time through a first photolithography process, and the second contacts CA2 may be formed at the same time through a second photolithography process. As a result of the simultaneous formation of the first contacts CAL it is possible for all of the first contacts CA1 to have substantially the same interval (i.e., the first distance L1). Similarly, as the result of the simultaneous formation of the second contacts CA2, it is possible for all of the second contacts CA2 to have substantially the same interval (i.e., the second distance L2).

In other words, with regard to the first contact CA1 between the first and second gate electrodes G1 and G2, the first contact CA1 may be spaced apart from the first gate electrode G1 by a first separation distance SL1 and may be spaced apart from the second gate electrode G2 by a second separation distance SL2. Here, the first and second separation distances SL1 and SL2 may or may not be equal to each other. For example, the first contact CA1 may be normally aligned to the first and second gate electrodes G1 and G2, and thus, the first and second separation distances SL1 and SL2 may be substantially the same. In other words, a ratio of the first separation distance SL1 to the second separation distance SL2 may have a unit value of 1.

With regard to the second contact CA2 between the second and third gate electrodes G2 and G3, the second contact CA2 may be spaced apart from the second gate electrode G2 by a third separation distance SL3 and may be spaced apart from the third gate electrode G3 by a fourth separation distance SL4. Here, the third and fourth separation distances SL3 and SL4 may or may not be equal to each other. As an example, the second contact CA2 may be positioned closer to the third gate electrode G3 than to the second gate electrode G2, and in this case, a ratio of the third separation distance SL3 to the fourth separation distance SL4 may have a value greater than 1.

The simultaneous formation of the first contacts CA1 may allow all of the first contacts CA1 to have the substantially same ratio of SL1/SL2 Similarly, the simultaneous formation of the second contacts CA2 may allow all of the second contacts CA2 to have the substantially same ratio of SL3/SL4. In any case, the ratio of SL1/SL2 is different from the ratio of SL3/SL4.

The second contact CA2 may be positioned closer to the third gate electrode G3 than to the second gate electrode G2, and this may make it possible to increase a separation margin between the second gate electrode G2 and the second contact CA2. Accordingly, it is possible to substantially prevent or suppress a short circuit from being formed between the second gate electrode G2 and the second contact CA2. Here, the third gate electrode G3 may be used as a dummy electrode, on the active patterns provided with the second contact CA2.

Furthermore, the second contact CA2 may be shifted toward the third gate electrode G3, and thus, at least a portion of the second contact CA2 may be overlapped with not only the source/drain region SD between the second and third gate electrodes G2 and G3 but also with the channel region AF below the third gate electrode G3. Accordingly, a volume of the source/drain region SD may be smaller between the first and second gate electrodes G1 and G2 than between the second and third gate electrodes G2 and G3. In the case of the PMOSFET region PR, an increase in volume of the source/drain regions SD may lead to an increase of a compressive stress applied to the channel regions AF therebetween. In other words, the shift of the second contact CA2 makes it possible to more effectively apply a compressive stress to the channel region AF positioned below the second gate electrode G2.

The first and second contacts CA1 and CA2 on the PMOSFET region PR according to other examples of the inventive concept will be described in more detail with reference to FIG. 3D.

Each of the first contacts CA1 may have a first width W1, when measured in the second direction D2. Each of the second contacts CA2 may have a second width W2, when measured in the second direction D2. In the case in which the first contacts CA1 are formed at the same time, all of the first contacts CA1 may have the substantially same width (i.e., the first width W1). Similarly, in the case in which the second contacts CA2 are formed at the same time, all of the second contacts CA2 may have the substantially same width (i.e., the second width W2). Here, the first width W1 may be different from the second width W2. Furthermore, bottom surfaces CAB1 of the first contacts CA1 may be positioned at substantially the same level, and bottom surfaces CAB2 of the second contacts CA2 may also be positioned at substantially the same level. Here, the bottom surfaces CAB1 of the first contacts CA1 may be positioned at a different level from that of the bottom surfaces CAB2 of the second contacts CA2.

A first recess RC1 or a second recess RC2 may be formed in an upper portion of each source/drain region SD. Here, the first contacts CA1 may include lower portions that are respectively provided in the first recesses RC1, and the second contacts CA2 may include lower portions that are respectively provided in the second recesses RC2. Here, in terms of vertical levels of their bottoms, the first recesses RC1 may be different from the second recesses RC2. This difference in vertical level of the bottoms of the first and second recesses RC1 and RC2 may result in or correspond to the above difference in vertical level of the bottom surfaces of the first and second contacts CA1 and CA2.

In some examples, contact spacers SP are interposed between the first and second contacts CA1 and CA2 and the first interlayer insulating layer 110. Each of the contact spacers SP may be provided to enclose sides the first and second contacts CA1 and CA2. The contact spacers SP may be formed of or include at least one of $SiO_2$, SiCN, SiCON, and SiN. The contact spacers SP may substantially prevent a short circuit from being formed between the first and second contacts CA1 and CA2 and the gate electrodes G1-G7. The formation of the contact spacers SP may include depositing a spacer layer in first and second contact holes OP1 and OP2, which will be described with reference to FIGS. 6 and 8, and anisotropically etching the spacer layer.

In some examples, metal silicide layers SC are interposed between the source/drain regions SD and the first and second contacts CA1 and CA2. In other words, the first and second contacts CA1 and CA2 may be electrically connected to the source/drain regions SD through the metal silicide layers SC. The metal silicide layers SC may be formed of or include at least one metal-silicide material (e.g., at least one material selected from the group consisting of titanium silicide, tantalum silicide, and tungsten silicide).

However, the contact spacers SP and the metal silicide layers SC may be omitted as previously described with reference to FIGS. 2, 3A, 3B, and 3C, and the inventive concept is not limited to specific structures of the contact spacers SP and the metal silicide layers SC.

Figure 4:
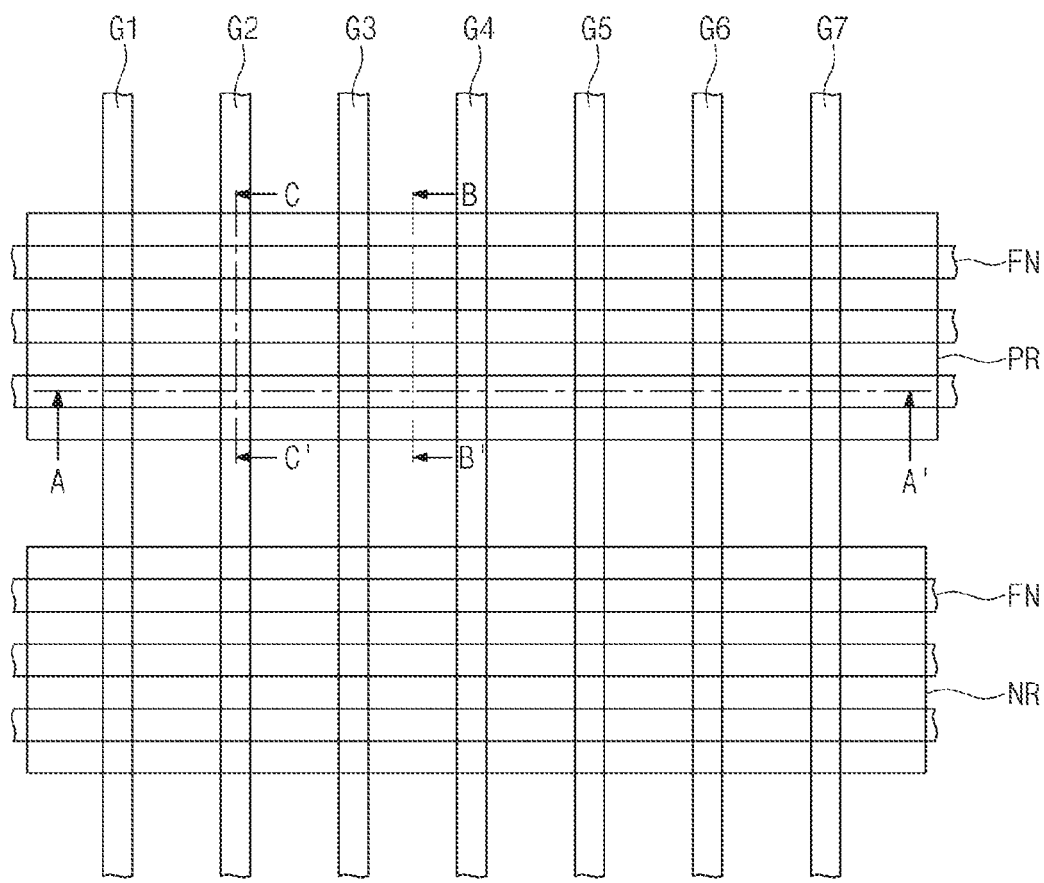
FIGS. 4, 6, and 8 are plan views illustrating examples of a method of fabricating a semiconductor device, according to the inventive concept.
Figure 4:
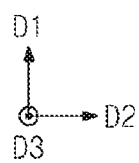
Figure 5A:
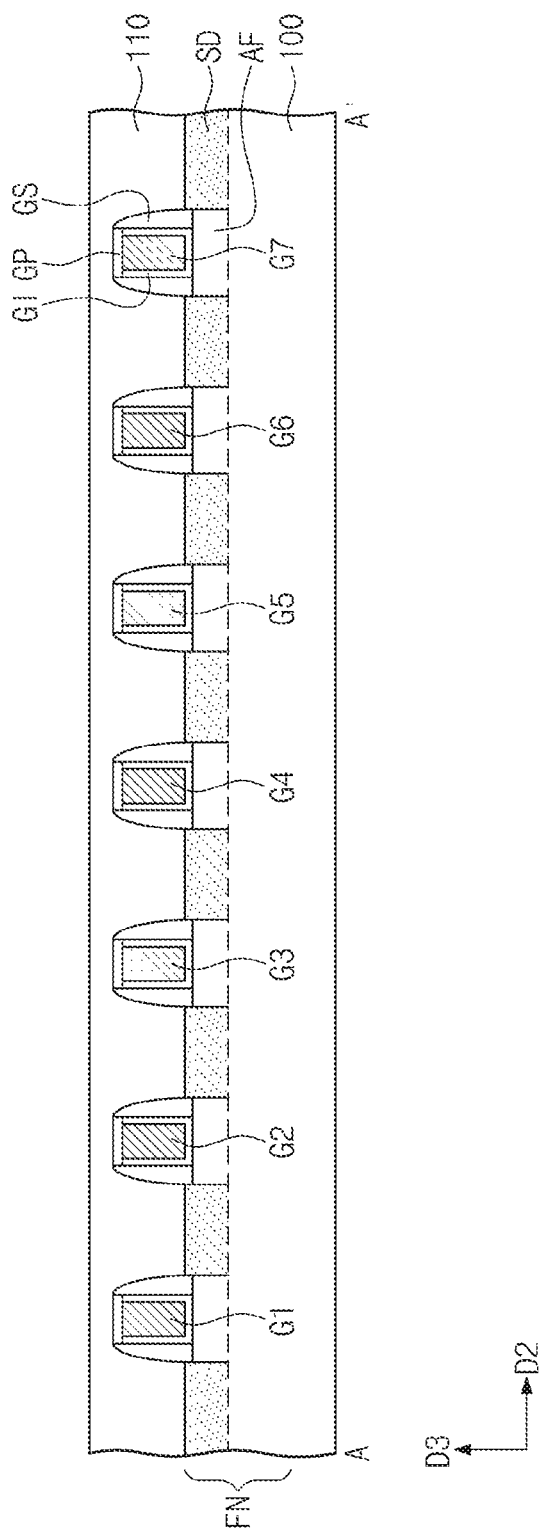
Figure 5B:
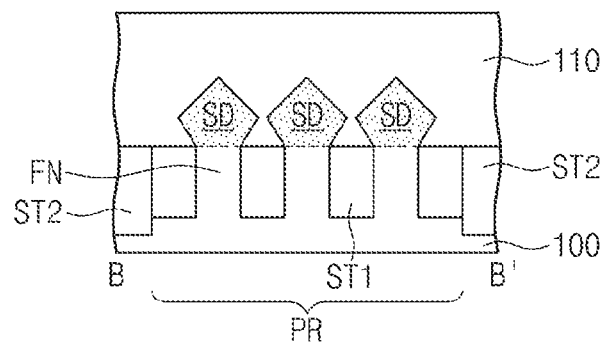
FIGS. 5B, 7B, and 9B are sectional views taken along lines B-B' of FIGS. 4, 6, and 8, respectively.
Figure 5C:
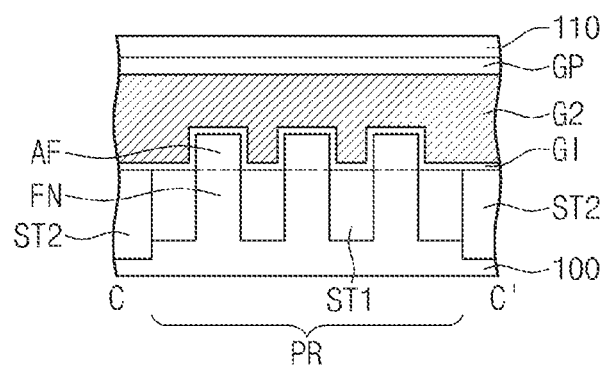
FIGS. 5C, 7C, and 9C are sectional views taken along lines C-C' of FIGS. 4, 6, and 8, respectively.
Figure 6:
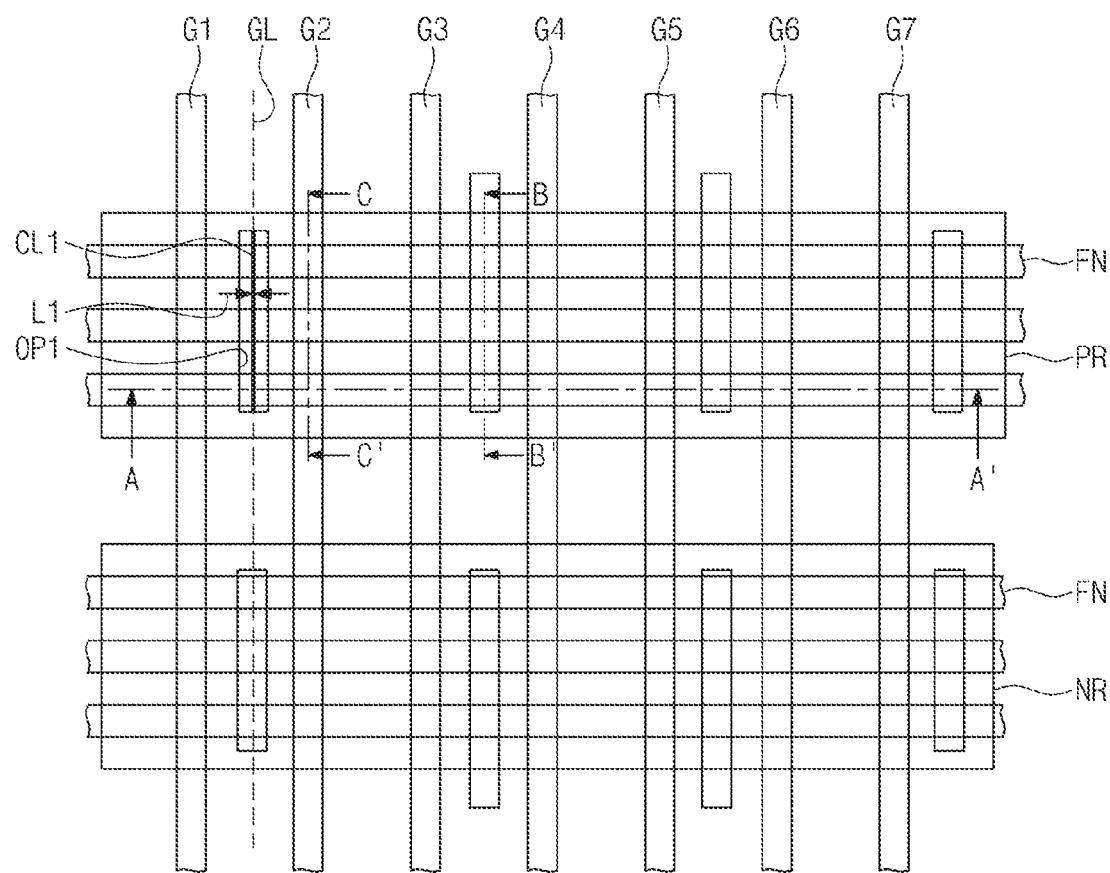
Figure 7B:
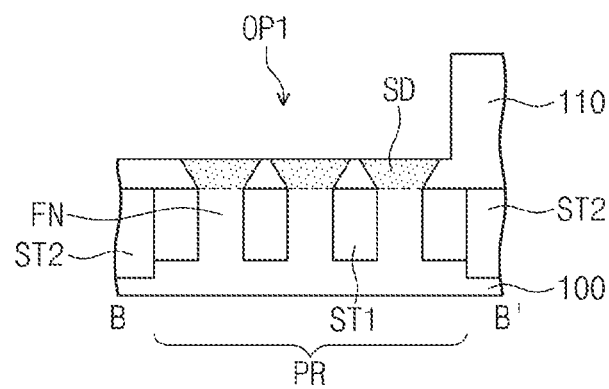
Figure 7B:
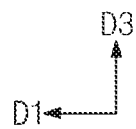
Figure 7C:
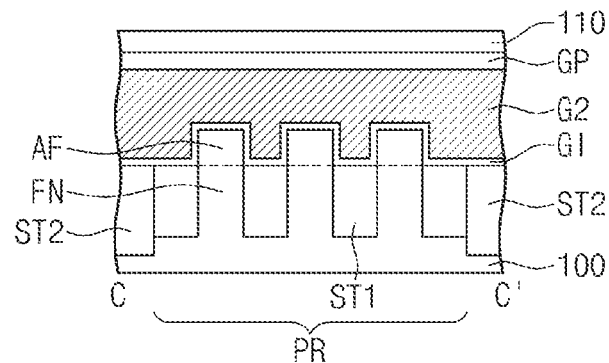
Figure 7C:
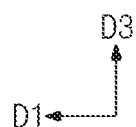
Figure 8:
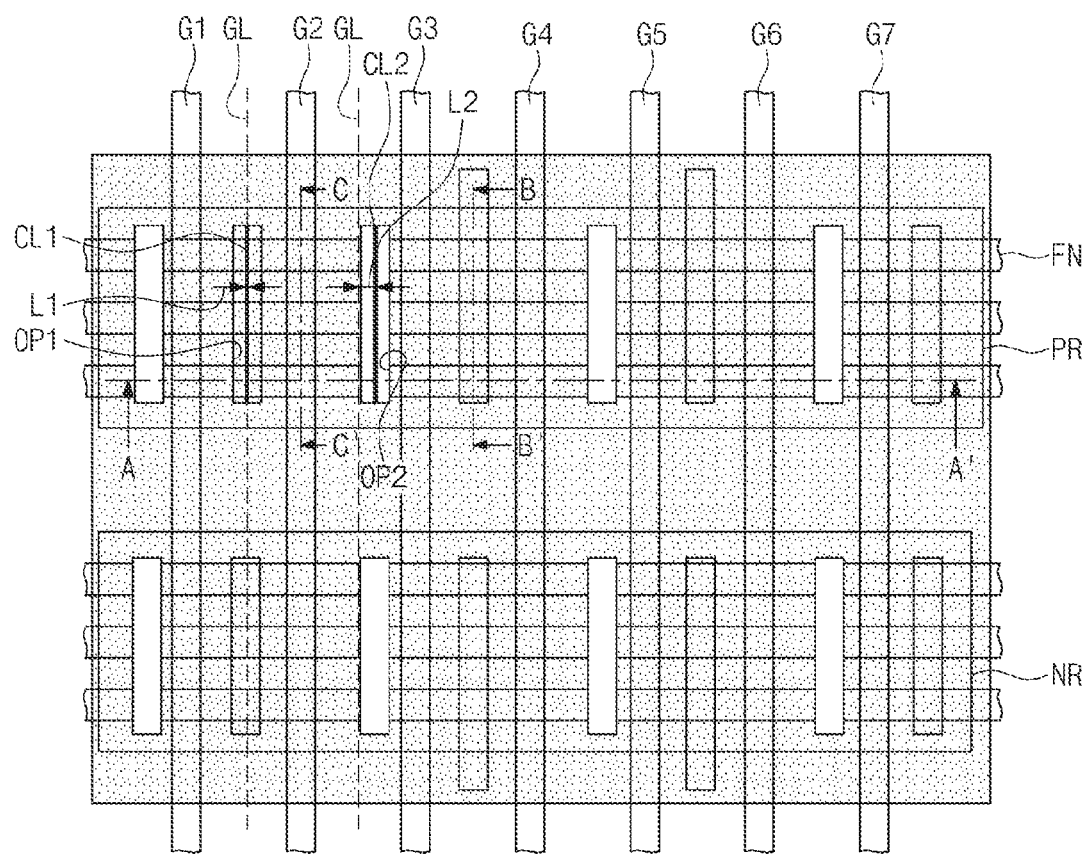
Figure 9A:
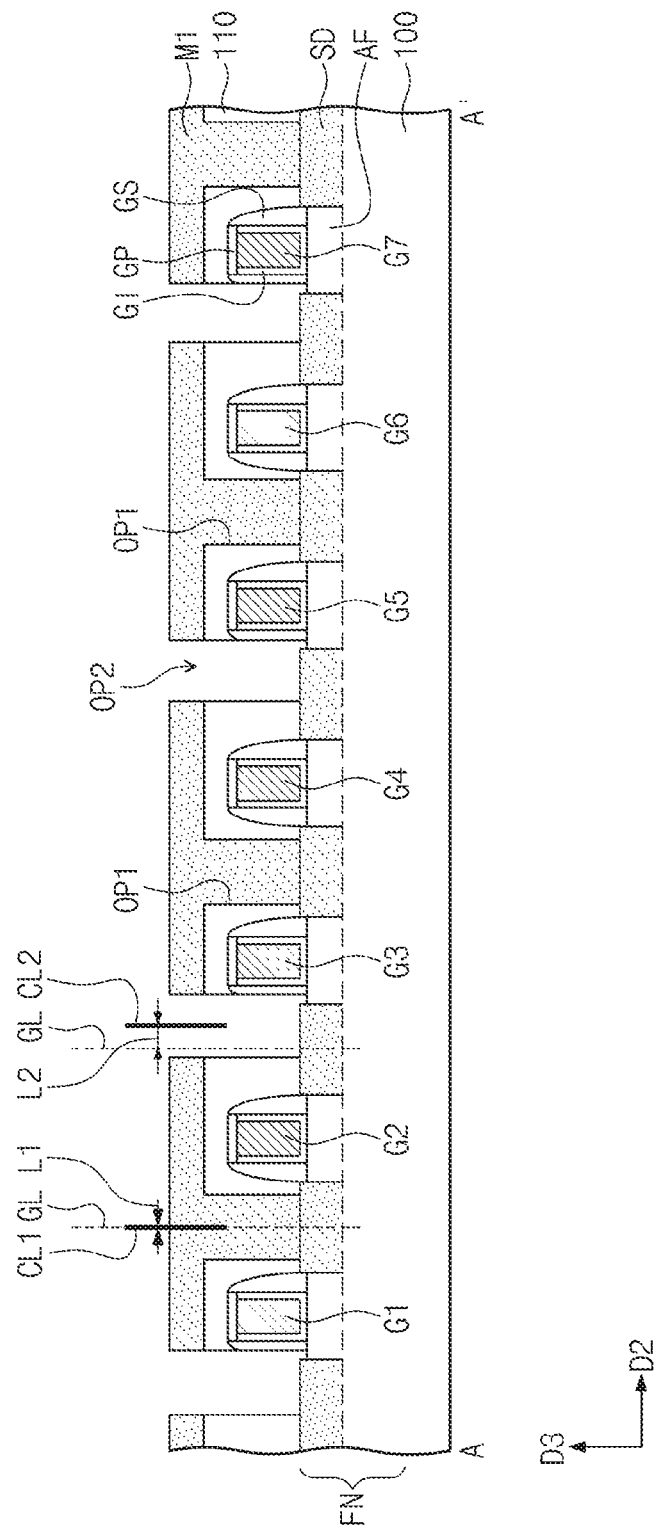
Figure 9B:
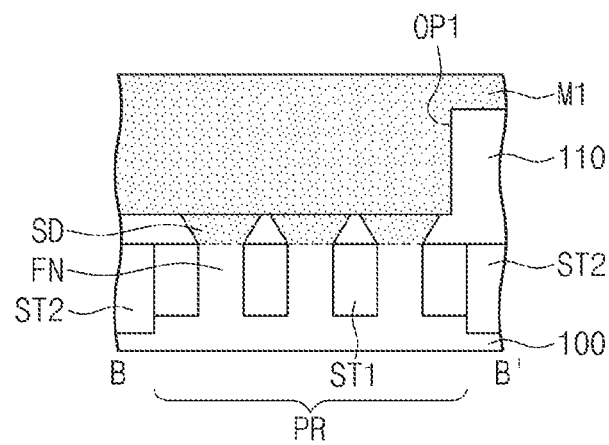
Figure 9B:
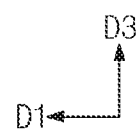
Figure 9C:
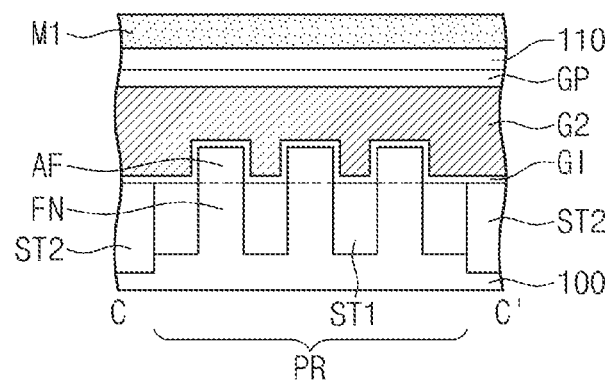
Figure 9C:
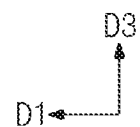

FIGS. 4, 6, and 8 are plan views illustrating a method of fabricating a semiconductor device, according to the inventive concept. FIGS. 5A, 7A, and 9A are sectional views taken along lines A-A' of FIGS. 4, 6, and 8, respectively, FIGS. 5B, 7B, and 9B are sectional views taken along lines B-B' of FIGS. 4, 6, and 8, respectively, and FIGS. 5C, 7C, and 9C are sectional views taken along lines C-C' of FIGS. 4, 6, and 8, respectively.

Referring to FIGS. 4, 5A, 5B, and 5C, the second device isolation layer ST2 may be formed on a substrate 100 to define the PMOSFET and NMOSFET regions PR and NR. In addition, the first device isolation layer ST1 may be formed on each of the PMOSFET and NMOSFET regions PR and NR to define a plurality of the active patterns FN. Each section of the first device isolation layer ST1 may be formed to extend in the second direction D2. The substrate 100 may be a silicon substrate, a germanium substrate, or a silicon-on-insulator (SOI) substrate. The first and second device isolation layers ST1 and ST2 may be formed by a shallow trench isolation (STI) process and may include, for example, a silicon oxide layer.

A depth or thickness of each of the first and second device isolation layer ST1 and ST2 refers to a dimension of the layer in a direction opposite to a third direction D3. The third direction D3 is a direction that is perpendicular to both of the first and second directions D1 and D2 (e.g., perpendicular to the top surface of the substrate 100). As an example, the first device isolation layer ST1 is formed to have a smaller depth than the second device isolation layers ST2. In this case, the first device isolation layer ST1 may be formed by a process different from that for the second device isolation layers ST2. As another example, the first device isolation layer ST1 may be formed at the same time as the second device isolation layer ST2, and in this case, the first device isolation layer ST1 may have substantially the same depth as the second device isolation layer ST2.

The active patterns FN may include fin portions protruding upward between sections of the first device isolation layer ST1. The active patterns FN may extend in the second direction D2.

The gate electrodes G1-G7 may be formed on the substrate 100 to cross the active patterns FN and extend parallel to the first direction D1. The gate electrodes G1-G7 may include the first to seventh gate electrodes G1-G7 extending parallel to each other and crossing the active patterns FN. The gate electrodes G1-G7 may be spaced apart from each other in the second direction D2.

The gate insulating pattern GI may be formed on the substrate 100 before the gate electrodes G1-G7 so as to be interposed between each of the gate electrodes G1-G7 and the substrate 100. The gate spacers GS may be formed at both sides of each of the gate electrodes G1-G7. In addition, the capping pattern GP may be formed to cover a top surface of each of the gate electrodes G1-G7. The gate insulating pattern GI may be interposed between each of the gate electrodes G1-G7 and the gate spacers GS.

The formation of the gate electrodes G1-G7, the gate insulating patterns GI, the capping patterns GP, and the gate spacers GS may include forming sacrificial gate patterns (not shown) on the substrate 100, forming the gate spacers GS at both sides of the sacrificial gate patterns, replacing the sacrificial gate patterns with the gate insulating patterns GI and the gate electrodes G1-G7, and forming the capping patterns GP to cover the gate electrodes G1-G7. The gate insulating patterns GI may be formed of or include at least one of a silicon oxide layer, a silicon oxynitride layer, and a high-k dielectric layer whose dielectric constant is higher than that of a silicon oxide layer. The gate electrodes G1-G7 may be formed of or include at least one of doped semiconductors, metals, and conductive metal nitrides. The gate spacers GS may be formed of or include at least one of a silicon oxide layer, a silicon nitride layer, and a silicon oxynitride layer.

An ion implantation process may be performed on the resulting structure provided with the gate electrodes G1-G7 to form the source/drain regions SD in upper portions of the active patterns FN. For example, the source/drain regions SD may be formed in the active patterns FN and at both sides of each of the gate electrodes G1-G7. The source/drain regions SD may not be formed below the gate electrodes G1-G7. In other words, the fin portions between the source/drain regions SD may serve as the channel regions AF. In a plan view, i.e., when viewed from above, the channel regions AF may overlap the gate electrodes G1-G7, respectively. As another example, the ion implantation process may be performed before replacing the sacrificial gate patterns with the gate electrodes G1-G7. In this case, the source/drain regions SD may be formed in the active patterns FN at both sides of each of the sacrificial gate patterns. The sacrificial gate patterns and the gate spacers GS may be used as masks during the ion implantation process.

The formation of the source/drain regions SD on the PMOSFET region PR may include injecting p-type impurities into the active patterns FN, and the formation of the source/drain regions SD on the NMOSFET region NR may include injecting n-type impurities into the active patterns FN. In examples, the source/drain regions SD are formed by forming epitaxial patterns on the active patterns FN. The forming of the epitaxial patterns may include removing upper portions of the active patterns FN at both sides of the gate electrodes G1-G7 and performing a selective epitaxial growth process using the substrate 100 as a seed layer. The impurities may be injected in-situ during the selective epitaxial growth process.

The first interlayer insulating layer 110 may be formed on the substrate 100 to cover the gate electrodes G1-G7 and the source/drain regions SD. The first interlayer insulating layer 110 may include at least one of a silicon oxide layer and a silicon oxynitride layer.

Referring to FIGS. 6, 7A, 7B, and 7C, a first photolithography process may be performed to form the first contact holes OP1 penetrating the first interlayer insulating layer 110. The first contact holes OP1 may be arranged along the second direction D2. The first contact holes OP1 may be spaced apart from each other with at least one of the gate electrodes G1-G7 interposed therebetween. As an example, a pair of the gate electrodes G1-G7 is interposed between the first contact holes OP1 spaced apart from each other. Furthermore, the first contact holes OP1 may be arranged alongside at least one of the gate electrodes G1-G7 and in the first direction D1. As an example, the first contact holes OP1 between the first and second gate electrodes G1 and G2 are respectively formed on the PMOSFET and NMOSFET regions PR and NR sequentially arranged along the first direction D1.

In more detail, the first photolithography process may include forming a photoresist layer on the first interlayer insulating layer 110. A photoresist pattern may be formed from the photoresist layer by a patterning process (e.g., exposing and developing processes) using a first photomask. The photoresist pattern may be formed to have openings defining positions and shapes of the first contact holes OP1. Subsequently, the first interlayer insulating layer 110 exposed by the openings may be etched using the photoresist pattern as an etch mask to form the first contact holes OP1 penetrating the first interlayer insulating layer 110. In certain cases, upper portions of the source/drain regions SD may be partially etched, during the etching of the first interlayer insulating layer 110. Subsequently, the photoresist pattern may be removed.

The first contact holes OP1 may be formed to expose the top surfaces of the source/drain regions SD. At least one of the first contact holes OP1 may extend in the first direction D1 to expose at least two of the source/drain regions SD, which are spaced apart from each other in the first direction D1 with the first device isolation layer ST1 interposed therebetween.

As described above, the gate center line GL may be equidistant from the first and second gate electrodes G1 and G2 and may be parallel to the first direction D1. Also, the first contact center line CL1 may extend along a center axis of the first contact hole OP1 or may be parallel to the first direction D1. Here, the first contact center line CL1 may be spaced apart from the gate center line GL by a first distance L1. In examples, the first distance L1 is substantially zero, and thus, the first contact hole OP1 may be normally aligned to be equidistant from the first and second gate electrodes G1 and G2.

Because all of the first contact holes OP1 are formed by the first photolithography process, all of the first contact holes OP1 may be formed to have substantially the same offset (namely, the first distance L1) from the gate center line GL midway between the gate electrodes adjacent the sides of the contact holes. Furthermore, all of the first contact holes OP1 may be formed to have the same width in the second direction D2. The bottoms of the first contact holes OP1 may be positioned at substantially the same level, similar to that shown in FIG. 3D.

Referring to FIGS. 8, 9A, 9B, and 9C, a first mask layer M1 may be formed on the first interlayer insulating layer 110 to fill the first contact holes OP1. The first mask layer M1 may be formed of or include a spin-on-hardmask (SOH) layer.

A second photolithography process may be performed to form the second contact holes OP2 penetrating the first mask layer M1 and the first interlayer insulating layer 110. The second contact holes OP2 may be arranged along the second direction D2. The second contact holes OP2 may be spaced apart from each other with at least one of the gate electrodes G1-G7 interposed therebetween. As an example, a respective pair of the gate electrodes G1-G7 may be interposed between adjacent ones of the second contact holes OP2 spaced apart from each other. Also, the second contact holes OP2 may be extend along a side of at least one of the gate electrodes G1-G7 in the first direction D1.

The second contact holes OP2 may be formed spaced apart from the first contact holes OP1. In other words, the second contact holes OP2 may not be superimposed on the first contact holes OP1. The first and second contact holes OP1 and OP2 may be alternately and repeatedly arranged in the second direction D2. The first and second contact holes OP1 and OP2 adjacent to each other in the second direction D2 may be spaced apart from each other with at least one respective gate electrodes G1-G7 interposed between adjacent ones of the first and second contact holes OP1 and OP2.

The second photolithography process may include forming a photoresist layer on the first mask layer M1. A photoresist pattern may be formed from the photoresist layer by a patterning process (e.g., exposing and developing processes) using a second photomask. The photoresist pattern may be formed to have openings defining positions and shapes of the second contact holes OP2. Subsequently, the first mask layer M1 and the first interlayer insulating layer 110 exposed by the openings may be etched using the photoresist pattern as an etch mask to form the second contact holes OP2 penetrating the first interlayer insulating layer 110. In certain examples, upper portions of the source/drain regions SD are partially etched during the etching of the first interlayer insulating layer 110. Subsequently, the photoresist pattern may be removed. The second photomask may be a photomask distinct from the first photomask. In other words, the first and second photolithography processes may be separately performed.

The second contact holes OP2 may be formed to expose the top surfaces of the source/drain regions SD. At least one of the second contact holes OP2 may extend in the first direction D1 to expose at least two of the source/drain regions SD, which are spaced apart from each other in the first direction D1 with the first device isolation layer ST1 interposed therebetween.

The gate center line GL may be equidistant from the second and third gate electrodes G2 and G3 and may be parallel to the first direction D1. The second contact center line CL2 may extend along a center axis of the second contact hole OP2 and parallel to the first direction D1. Here, the second contact center line CL2 may be spaced apart from the gate center line GL by a second distance L2. As an example, the second contact hole OP2 is closer to the third gate electrode G3 than to the second gate electrode G2, and in this case, the second distance L2 has a positive value, when measured along the second direction D2.

Because all of the second contact holes OP2 are formed by the second photolithography process, all of the second contact holes OP2 may be formed to have substantially the same offset (namely, the second distance L2) from their corresponding gate center lines GL. Here, the first distance L1 may be different from the second distance L2. In other words, the set of first contact holes OP1 and the set of second contact holes OP2 may be laterally offset differently from one another relative to the gate electrodes G1-G7. Furthermore, all of the second contact holes OP2 may be formed to have the same width in the second direction D2. The bottoms of the second contact holes OP2 may be positioned at substantially the same level, similar to that shown in FIG. 3D. The width of the second contact holes OP2 may be different from the width of the first contact holes OP1. The bottoms of the first contact holes OP1 may be positioned at a level different from those of the second contact holes OP2.

Referring back to FIGS. 2, 3A, 3B, and 3C, the first mask layer M1 may be removed. For example, the first mask layer M1 is removed through ashing and strip processes.

Subsequently, the barrier layer BL and a conductive layer may be formed on the first interlayer insulating layer 110 to fill the first and second contact holes OP1 and OP2. The conductive layer may be formed of or include at least one of doped semiconductor materials, metals, and conductive metal nitride materials. As an example, the conductive layer is formed of or includes tungsten, and the barrier layer BL is formed of or includes Ti/TiN. A planarization process may be performed on the barrier layer BL and the conductive layer to expose the first interlayer insulating layer 110, and thus, the first and second contacts CA1 and CA2 may be locally formed in the first and second contact holes OP1 and OP2. As a result of the planarization process, the first and second contacts CA1 and CA2 may be formed to have top surfaces substantially coplanar with that of the first interlayer insulating layer 110.

Subsequently, the second interlayer insulating layer 120 and the third interlayer insulating layer 130 may be sequentially formed on the first interlayer insulating layer 110 to cover the first and second contacts CA1 and CA2. Vias V1-V4 may be formed to penetrate the second interlayer insulating layer 120, and the conductive line CBL and the wires PW1 and PW2 may be formed in the third interlayer insulating layer 130. The second and third interlayer insulating layers 120 and 130 may be formed of or include a silicon oxide layer or a silicon oxynitride layer.

Figure 10:
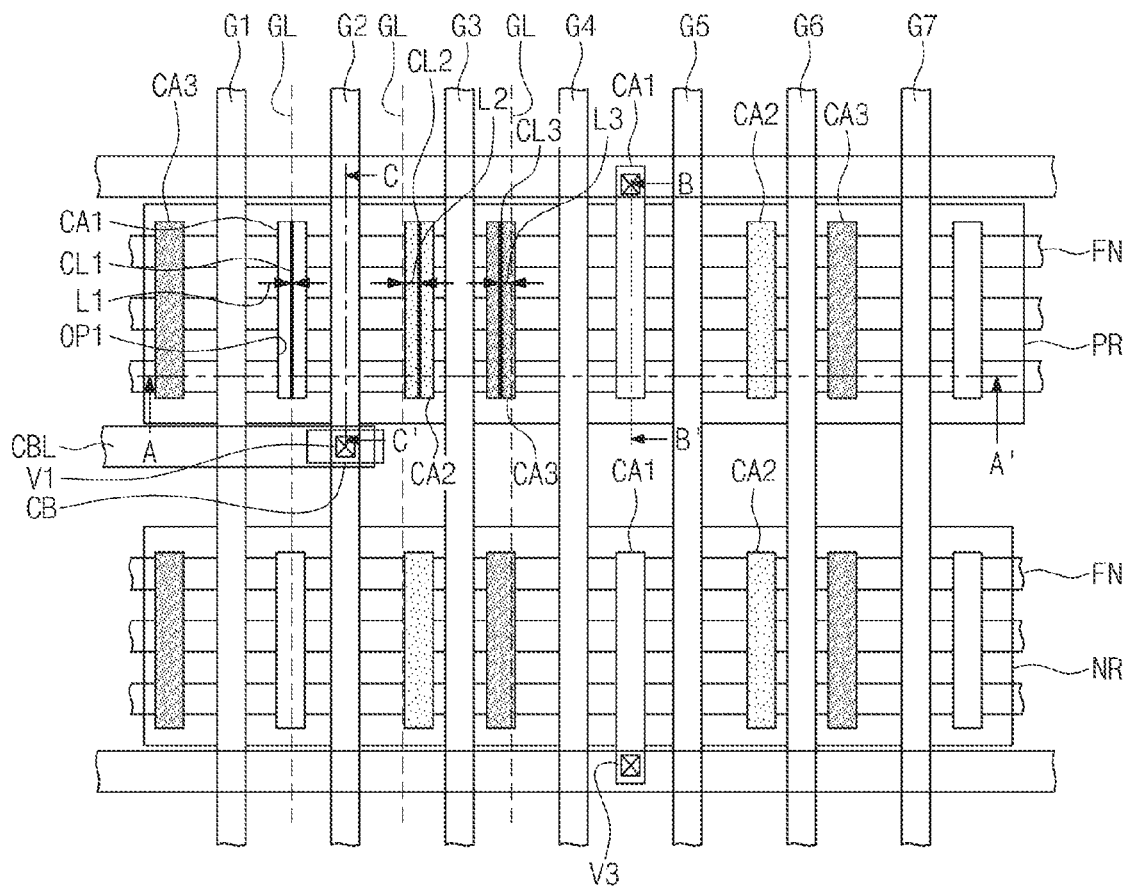
FIG. 10 is a plan view illustrating other examples of a portion of a semiconductor device according to the inventive concept.
Figure 11:
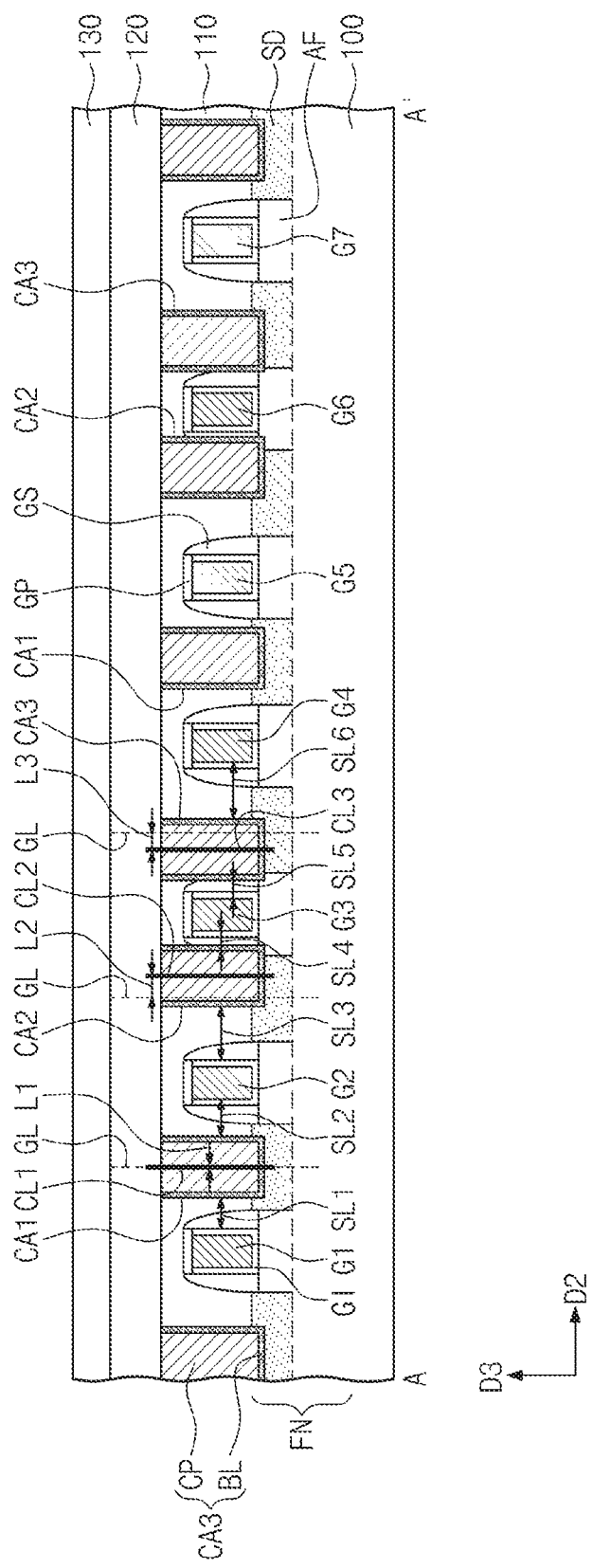
FIG. 11 is a sectional view taken along line A-A' of FIG. 10.

FIG. 10 is a plan view illustrating a portion of a semiconductor device according the inventive concept. FIG. 11 is a sectional view taken along line A-A' of FIG. 10. In the following description, an element previously described with reference to FIGS. 2, 3A, 3B, and 3C may be identified by a similar or identical reference number such that another description thereof is unnecessary. FIGS. 3B and 3C correspond to sectional views taken along lines B-B' and C-C' of FIG. 10.

Referring to FIGS. 10, 11, 3B, and 3C, first to third contacts CA1, CA2, and CA3 may be provided between gate electrodes G1-G7. The first to third contacts CA1, CA2, and CA3 may be arranged along the active patterns FN or in a second direction D2. As an example, the first contacts CAL the second contacts CA2, and the third contacts CA3 are alternately and repeatedly arranged in the second direction D2. In FIG. 10, the first to third contacts CA1, CA2, and CA3 are differently hatched, for distinction. Furthermore, the first to third contacts CA1, CA2, and CA3 may extend alongside one of the gate electrodes G1-G7 in a first direction D1. As an example, the third contacts CA3 may be provided between the first and second gate electrodes G1 and G2 and on each of the PMOSFET and NMOSFET regions PR and NR and may be arranged in the first direction D1.

More specifically, for example, on the PMOSFET region PR, at least one of the third contacts CA3 is shaped like a bar extending in the first direction D1. The at least one of the third contacts CA3 may be provided to connect a plurality of the source/drain regions SD, which are spaced apart from each other in the first direction D1 with the first device isolation layer ST1 interposed therebetween. The source/drain regions SD on the NMOSFET region NR may be connected to each other by the third contacts CA3, in the same manner as those on the PMOSFET region PR.

Each of the first to third contacts CA1, CA2, and CA3 may include a conductive pillar CP and a barrier layer BL covering side and bottom surfaces of the conductive pillar CP. As an example, the conductive pillar CP is formed of or includes tungsten, and the barrier layer BL is formed of or includes Ti/TiN.

As previously described with reference to FIGS. 2 and 3A, the first contact center line CL1 of each of the first contacts CA1 may be spaced apart from a corresponding one of the gate center lines GL by a first distance L1. The second contact center line CL2 of each of the second contacts CA2 may be spaced apart from a corresponding one of the gate center lines GL by a second distance L2. Here, the gate center line GL may be equidistant from the third and fourth gate electrodes G3 and G4 and may be parallel to the first direction D1. Also, a third contact center line CL3 may extend along a center axis of the third contact CA3 and parallel to the first direction D1. Here, the third contact center line CL3 may be spaced apart from a corresponding one of the gate center lines GL by a third distance L3. In an example, the third distance L3 has a negative value in the second direction D2. In other words, the third contact CA3 may be closer to the third gate electrode G3 than the fourth gate electrode G4.

The third contacts CA3 may be simultaneously formed, and thus, all of the third contacts CA3 may have the same lateral offset, namely, the third distance L3, from their corresponding gate center lines GL. The first to third distances L1, L2, and L3 may be different from each other. In other words, the sets of first to third contacts CA1, CA2, and CA3 may be laterally offset by different amounts relative to the gate electrodes G1-G7.

With regard to the third contact CA3 between the third and fourth gate electrodes G3 and G4, the third contact CA3 and the third gate electrode G3 may be spaced apart from each other by a fifth separation distance SL5 and the third contact CA3 and the fourth gate electrode G4 may be spaced apart from each other by a sixth separation distance SL6. In examples, the fifth and sixth separation distances SL5 and SL6 may be substantially the same, but in other examples, they may be different from each other. In the case where the third gate electrode G3 is closer to the third contact CA3 than to the fourth gate electrode G4, a ratio of the fifth separation distance SL5 to the sixth separation distance SL6 may be smaller than 1.

The simultaneous formation of the third contacts CA3 may allow all of the third contacts CA3 to have the same ratio of SL5/SL6. The ratio of SL5/SL6 for the third contacts CA3 may be different from the ratio (e.g., SL1/SL2) for the first contacts CA1 and the ratio (e.g., SL3/SL4) for the second contacts CA2.

The third contact CA3 may be closer to the third gate electrode G3 than to the fourth gate electrode G4, and thus, it is possible to increase a separation margin between the fourth gate electrode G4 and the third contact CA3. Accordingly, it is possible to substantially prevent or suppress a short circuit from being formed between the fourth gate electrode G4 and the third contact CA3. Here, on the active patterns provided with the third contact CA3, the third gate electrode G3 may be used as a dummy electrode.

Furthermore, the third contact CA3 may be shifted toward the third gate electrode G3, and thus, at least a portion of the third contact CA3 may be overlapped with not only the source/drain region SD between the third and fourth gate electrodes G3 and G4 but also the channel region AF below the third gate electrode G3. This may lead to an increase in volume of the source/drain region SD that is provided between the third and fourth gate electrodes G3 and G4. Furthermore, the shift of the third contact CA3 on the PMOSFET region PR makes it possible to more effectively apply a compressive stress to the channel region AF positioned below the fourth gate electrode G4.

In the case where the third contacts CA3 are formed at the same time, the third contacts CA3 may have the same width (dimension in the second direction D2). The width of the third contacts CA3 may be different from the widths W1 and W2 of the first and second contacts CA1 and CA2, previously described with reference to FIG. 3D. In addition, the third contacts CA3 may be provided in such a way that bottoms surfaces thereof are positioned at substantially the same level. Here, the bottom surfaces of the third contacts CA3 may be positioned at a different level from those of the first contacts CA1 and the second contacts CA2.

Figure 12:
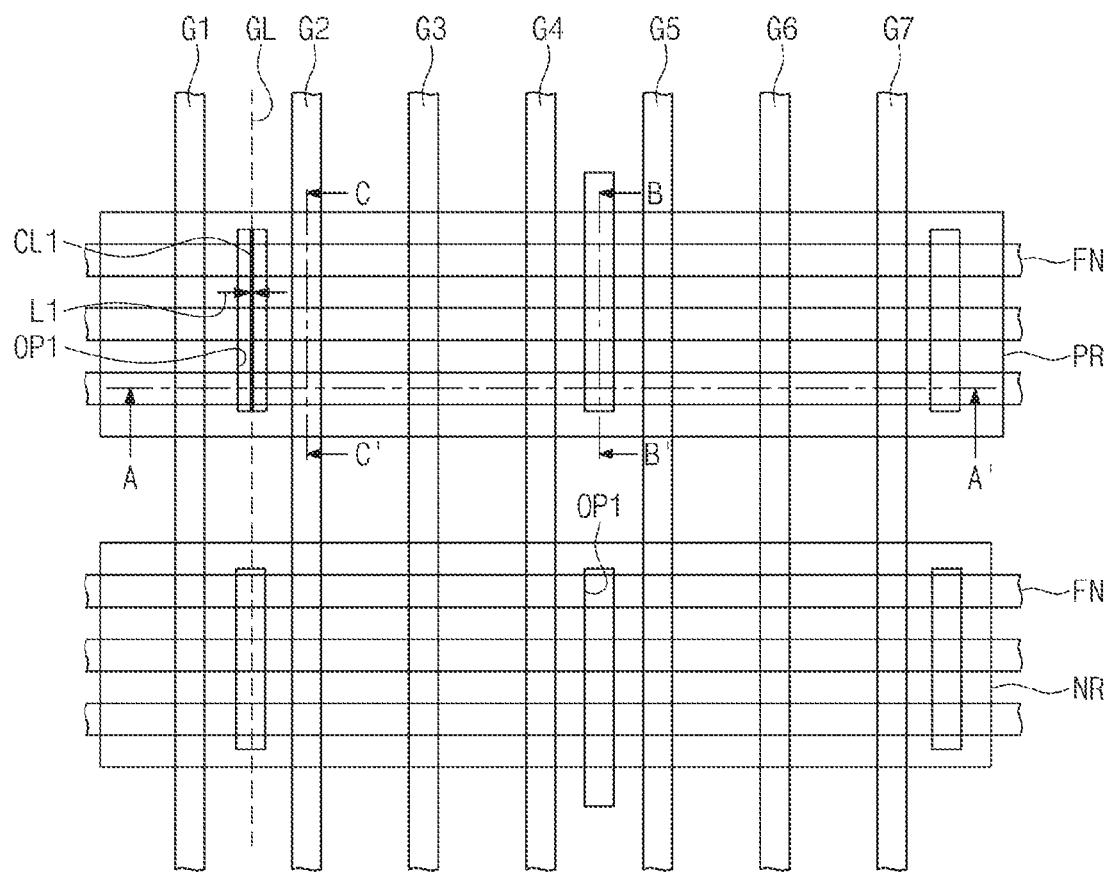
FIGS. 12, 14, and 16 are plan views illustrating other examples of a method of fabricating a semiconductor device, according to the inventive concept.
Figure 13:
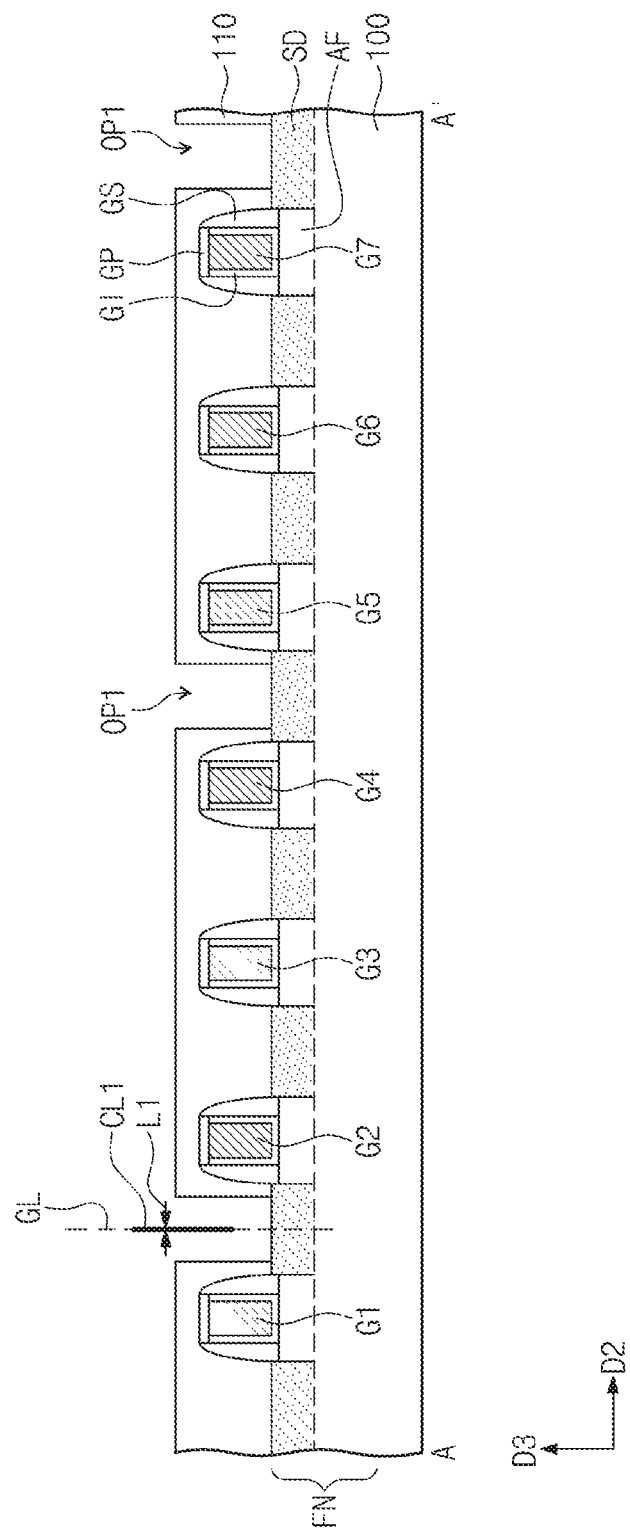
FIGS. 13, 15, and 17A are sectional views taken along lines A-A' of FIGS. 12, 14, and 16, respectively.
Figure 14:
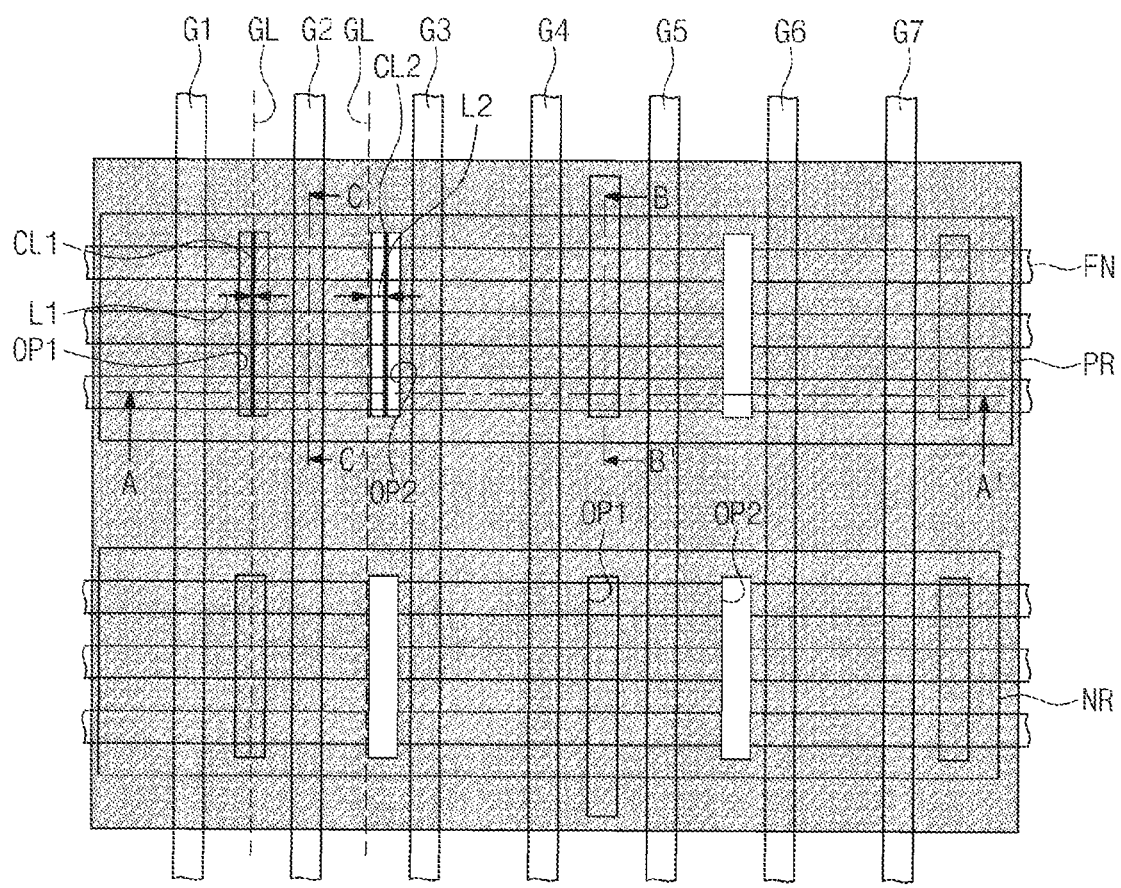
Figure 15:
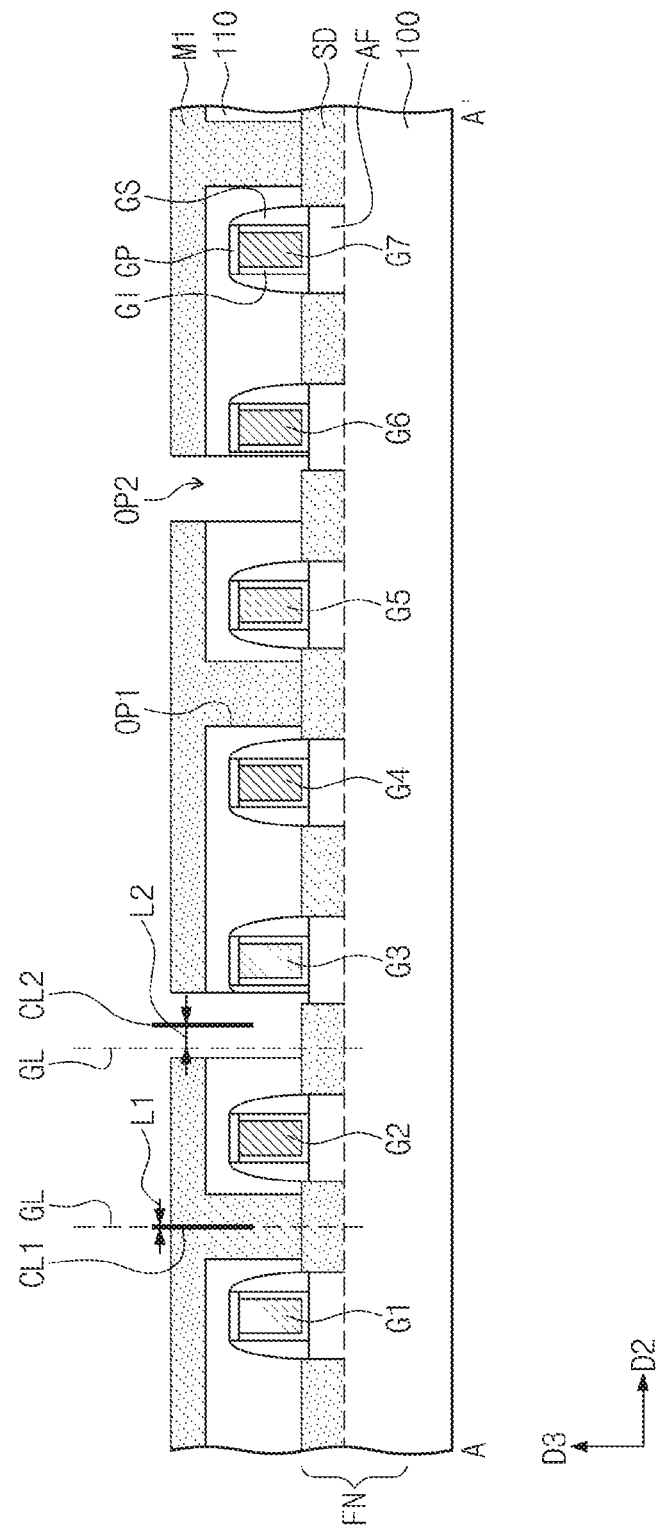
Figure 16:
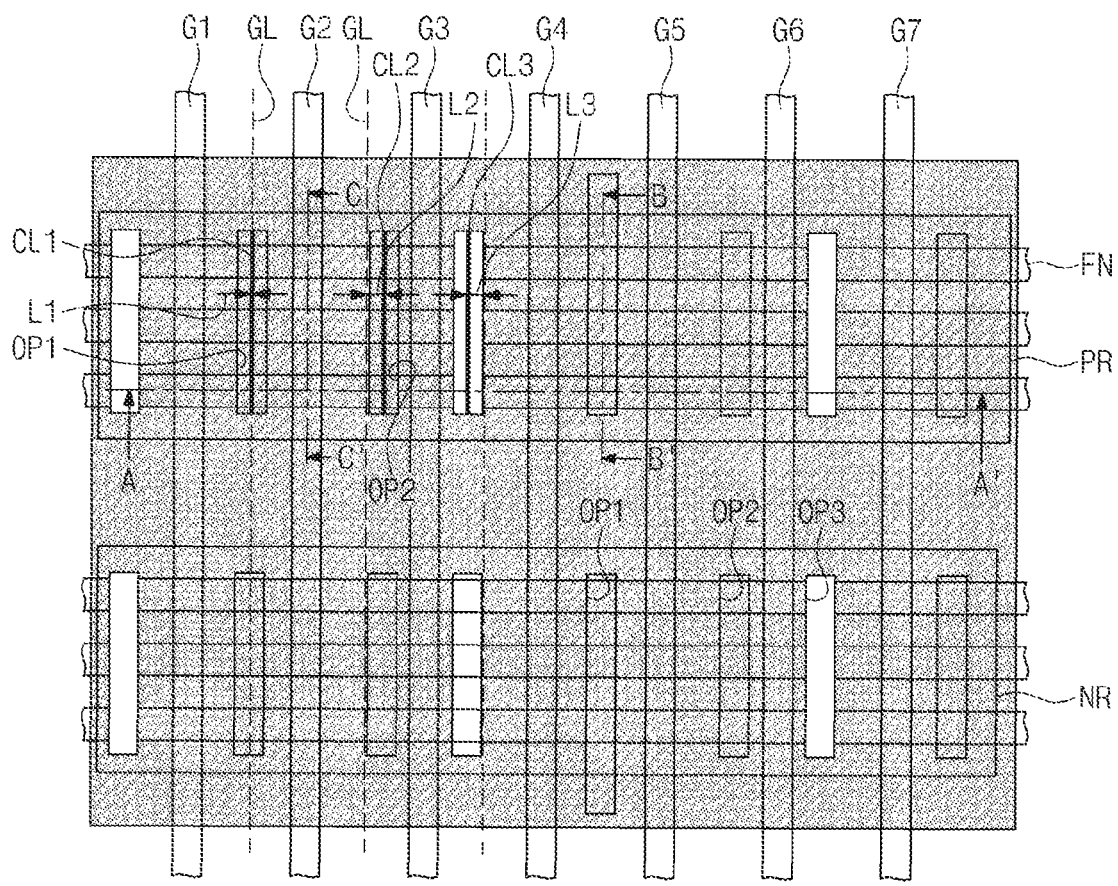
Figure 17A:
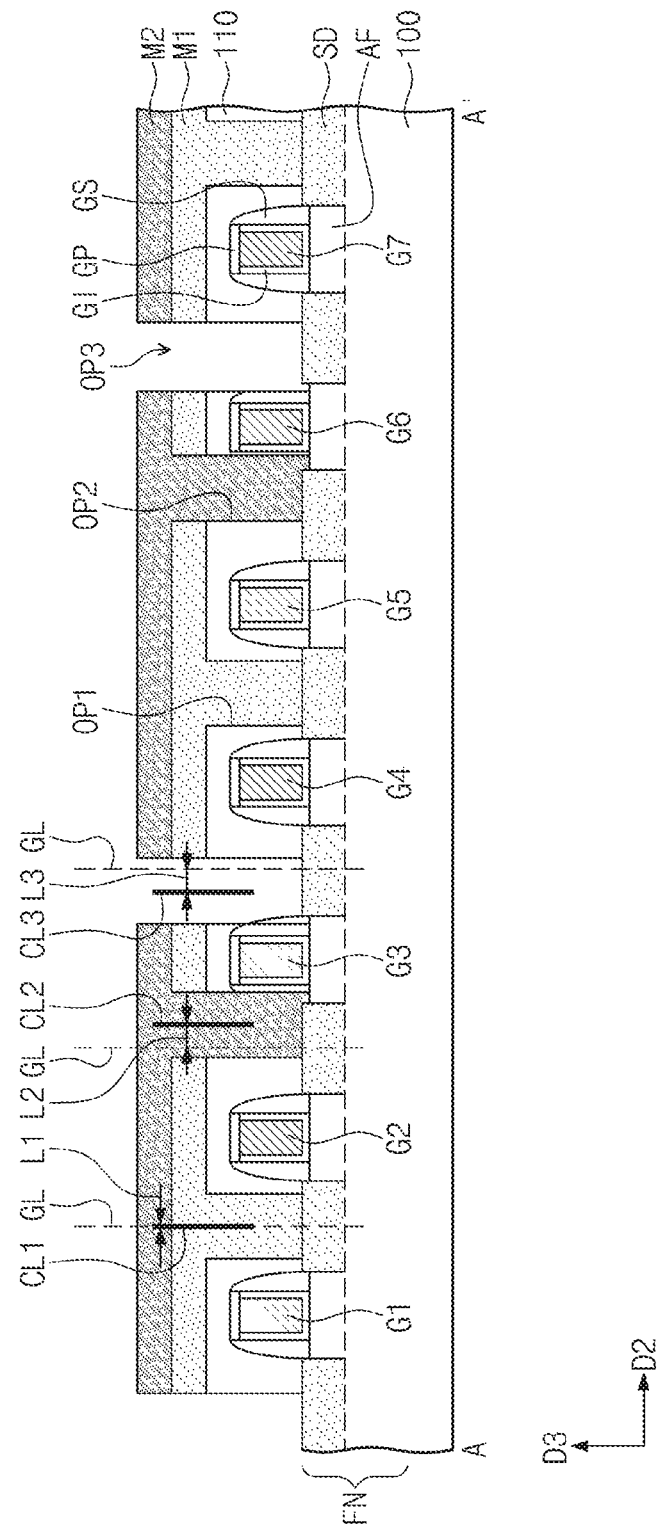
Figure 17B:
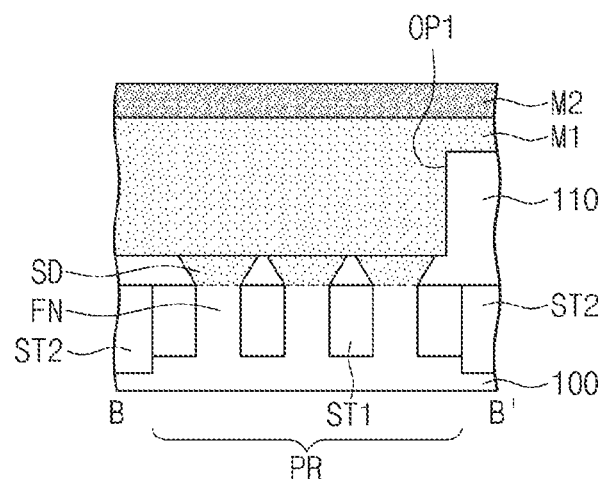
FIG. 17B is a sectional view taken along line B-B' of FIG. 16.
Figure 17B:
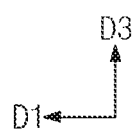
Figure 17C:
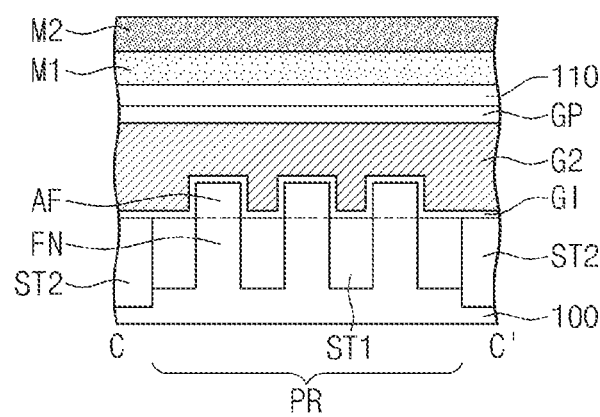
FIG. 17C is a sectional view taken along line C-C' of FIG. 16.
Figure 17C:
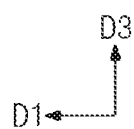

FIGS. 12, 14, and 16 are plan views illustrating an other example of a method of fabricating a semiconductor device, according to the inventive concept. FIGS. 13, 15, and 17A are sectional views taken along lines A-A of FIGS. 12, 14, and 16, respectively, and FIG. 17B are sectional views taken along lines B-B' and C-C', respectively, of FIG. 16. In the following description of the present embodiment, an element or step previously described with reference to FIGS. 4 through 9C may be identified by a similar or identical reference number so that another description thereof is unnecessary. FIGS. 7B and 9B may correspond to sections taken along lines B-B' of FIGS. 12 and 14, respectively, and FIGS. 7C and 9C may correspond to sections taken along lines C-C' of FIGS. 12 and 14, respectively.

Referring to FIGS. 12, 13, 7B, and 7C, a first photolithography process may be performed on the structure of FIGS. 4, 5A, 5B, and 5C to form the first contact holes OP1 penetrating the first interlayer insulating layer 110. The first contact holes OP1 may be spaced apart from each other with at least one respective gate electrode G1-G7 interposed between adjacent ones of the first contact holes OP1. As an example, three respective ones of the gate electrodes G1-G7 may be interposed between adjacent ones of the first contact holes OP1 for each pair of adjacent ones of the first contact holes OP1. The first photolithography process and the first contact holes OP1 may have substantially the same features as those of the previous examples described with reference to FIGS. 6, 7A, 7B, and 7C.

Referring to FIGS. 14, 15, 9B, and 9C, the first mask layer M1 may be formed on the first interlayer insulating layer 110 to fill the first contact holes OP1. Subsequently, a second photolithography process may be performed to form the second contact holes OP2 penetrating the first mask layer M1 and the first interlayer insulating layer 110. The second contact holes OP2 may be spaced apart from each other with at least one of the gate electrodes G1-G7 interposed therebetween. As an example, three of the gate electrodes G1-G7 may be interposed between adjacent ones of the second contact holes OP2 for each pair of adjacent ones of the second contact holes OP2. The second photolithography process and the second contact holes OP2 may have substantially the same features as those of the previous examples described with reference to FIGS. 8, 9A, 9B, and 9C.

Referring to FIGS. 16, 17A, 17B, and 17C, a second mask layer M2 may be formed on the first mask layer M1 to fill the second contact holes OP2. The second mask layer M2 may be formed of or include a spin-on-hardmask (SOH) layer.

A third photolithography process may be performed to form third contact holes OP3 penetrating the second mask layer M2, the first mask layer M1, and the first interlayer insulating layer 110. The third contact holes OP3 may be arranged along the second direction D2. The third contact holes OP3 may be spaced apart from each other with at least one of the gate electrodes G1-G7 interposed therebetween adjacent ones thereof. As an example, three respective ones of the gate electrodes G1-G7 are interposed between adjacent ones of the third contact holes OP3 for each pair of the adjacent ones of the third contact holes OP3. Furthermore, the third contact holes OP3 may extend alongside at least one of the gate electrodes G1-G7 in the first direction D1.

The third contact holes OP3 may be formed spaced apart from the first and second contact holes OP1 and OP2. In other words, the third contact holes OP3 may not be superimposed on the first and second contact holes OP1 and OP2. The first to third contact holes OP1, OP2, and OP3 may be alternately and repeatedly arranged in the second direction D2. When viewed in the second direction D2, adjacent ones of the first to third contact holes OP1, OP2, and OP3 may have at least one of the gate electrodes G1-G7 interposed therebetween.

More specifically, the third photolithography process may include forming a photoresist layer on the second mask layer M2. A photoresist pattern may be formed from the photoresist layer by a patterning process (e.g., exposing and developing processes) using a third photomask. The photoresist pattern may be formed to have openings defining positions and shapes of the third contact holes OP3. Subsequently, the second mask layer M2, the first mask layer M1, and the first interlayer insulating layer 110 exposed by the openings may be etched using the photoresist pattern as an etch mask to form the third contact holes OP3 penetrating the first interlayer insulating layer 110. In certain examples, upper portions of the source/drain regions SD are partially etched during the etching of the first interlayer insulating layer 110. Subsequently, the photoresist pattern may be removed. The third photomask may be different from the first and second photomasks for the first and second photolithography processes. In other words, the first to third photolithography processes may be separately performed.

The third contact holes OP3 may be formed to expose top surfaces of the source/drain regions SD. At least one of the third contact holes OP3 may extend in the first direction D1 and may expose at least two ones of the source/drain regions SD, which are spaced apart from each other in the first direction D1 with the first device isolation layer ST1 interposed therebetween.

In certain examples, the gate center line GL is equidistant from the third and fourth gate electrodes G3 and G4 and may be parallel to the first direction D1. The third contact center line CL3 may extend along the center axis of the third contact CA3 and parallel to the first direction D1. Here, the third contact center line CL3 may be spaced apart from the gate center line GL by a third distance L3. As an example, the third contact hole OP3 may be closer to the third gate electrode G3 than to the fourth gate electrode G4, and in this case, the third distance L3 has a negative value, when measured along the second direction D2.

Because all of the third contact holes OP3 are formed by the third photolithography process, all of the third contact holes OP3 may be formed to have substantially the same lateral offset (namely, the third distance L3) from their associate gate center lines GL. Here, the third distance L3 may be different from the first distance L1 (offset of the first contact holes OP1) and the second distance L2 (offset of the second contact holes OP2). In other words, the sets of first to third contact holes OP1, OP2, and OP3 may be laterally offset relative to the gate electrodes G1-G7 by different amounts from one another.

Referring back to FIGS. 10, 11, 3B, and 3C, the first and second mask layers M1 and M2 may be removed. The first mask layer M1 and the second mask layer M2 may be removed through ashing and strip processes.

Subsequently, the barrier layer BL and the conductive layer may be formed on the first interlayer insulating layer 110 to fill the first to third contact holes OP1, OP2, and OP3. The conductive layer may be formed of or include at least one of doped semiconductor materials, metals, and conductive metal nitride materials. As an example, the conductive layer is formed of or includes tungsten, and the barrier layer BL is formed of or includes Ti/TiN. A planarization process may be performed on the barrier layer BL and the conductive layer to expose the first interlayer insulating layer 110, and thus, the first to third contacts CA1, CA2, and CA3 may be locally formed in the first to third contact holes OP1, OP2, and OP3. As a result of the planarization process, the first to third contacts CA1, CA2, and CA3 may be formed to have top surfaces substantially coplanar with that of the first interlayer insulating layer 110.

Subsequently, the second interlayer insulating layer 120 and the third interlayer insulating layer 130 may be sequentially formed on the first interlayer insulating layer 110 to cover the first and second contacts CA1 and CA2. The vias V1-V4 may be formed to penetrate the second interlayer insulating layer 120, and the conductive line CBL and the wires PW1 and PW2 may be formed in the third interlayer insulating layer 130.

Figure 18:
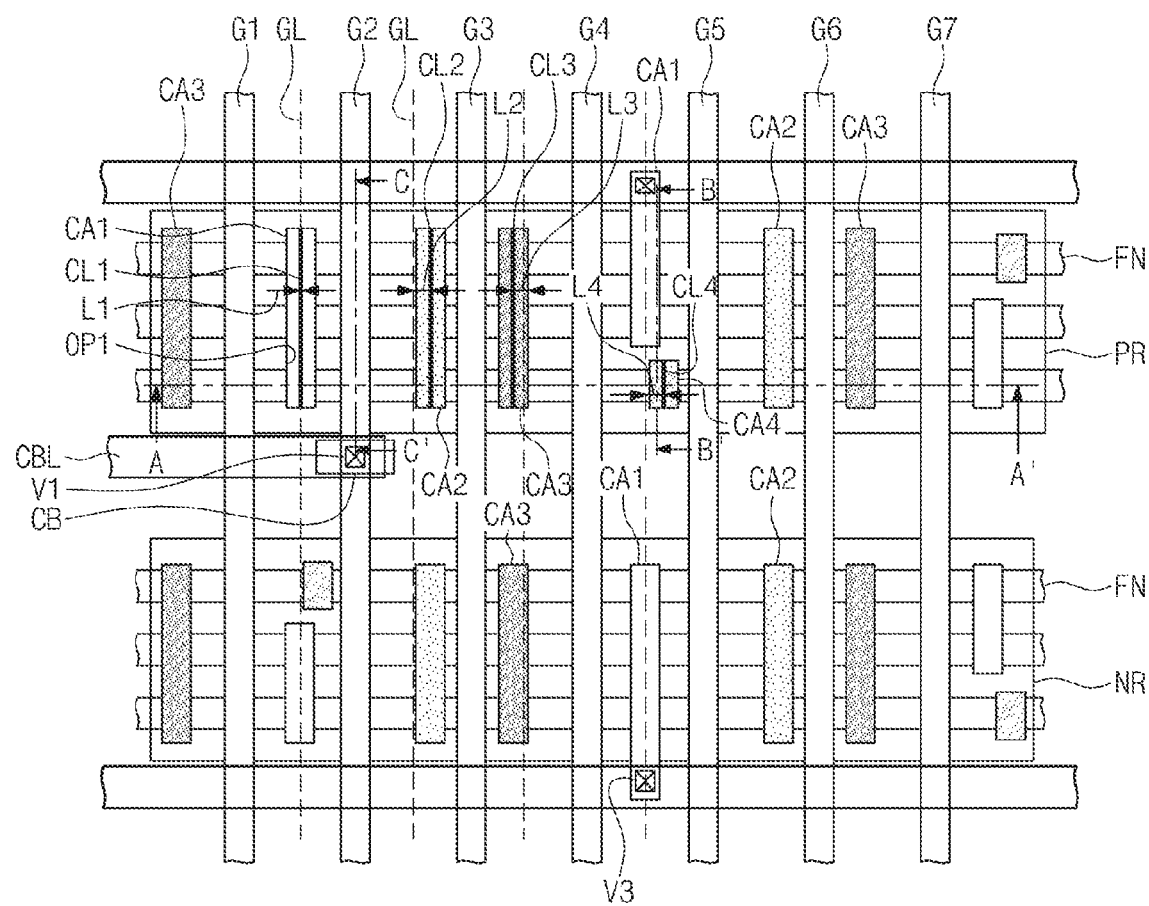
FIG. 18 is a plan view illustrating still other examples of a portion of a semiconductor device according to the inventive concept.
Figure 19A:
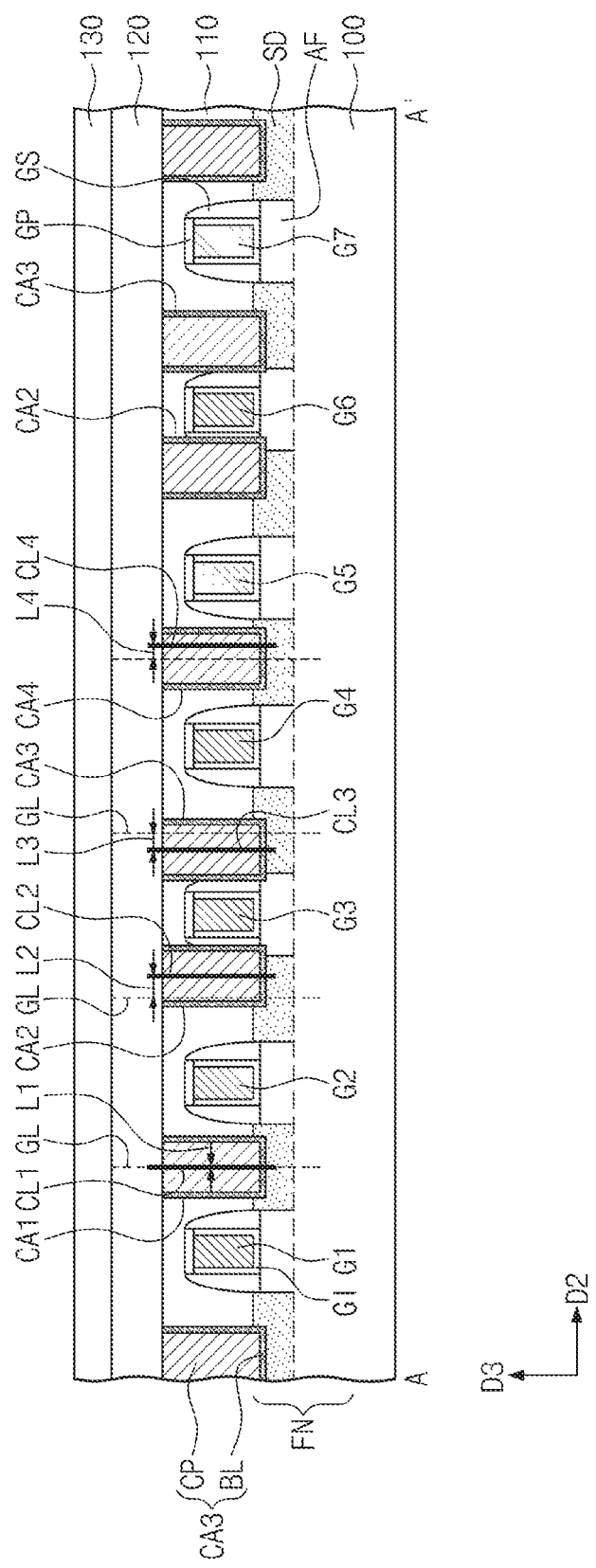
FIGS. 19A and 19B are sectional views taken along lines A-A' and B-B', respectively, of FIG. 18.
Figure 19B:
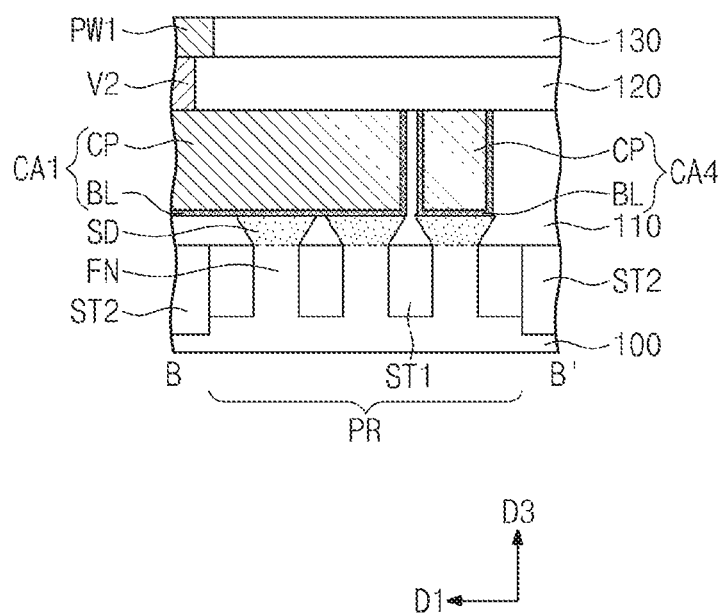

FIG. 18 is a plan view illustrating still another example of a portion of a semiconductor device according to the inventive concept. FIGS. 19A and 19B are sectional views taken along lines A-A' and B-B', respectively, of FIG. 18. In the following description of the present embodiment, an element previously described with reference to FIGS. 10, 11, 3B, and 3C may be identified by a similar or identical reference number so that another description thereof is unnecessary. FIG. 3C may correspond to a sectional view taken along line C-C' of FIG. 18.

Referring to FIGS. 18, 19A, 19B, and 3C, first to fourth contacts CA1, CA2, CA3, and CA4 may be provided between the gate electrodes G1-G7. The first to fourth contacts CA1, CA2, CA3, and CA4 may be arranged along the active patterns FN or in the second direction D2. In FIG. 18, the first to fourth contacts CA1, CA2, CA3, and CA4 are differently hatched, for distinction. Furthermore, the first to fourth contacts CA1, CA2, CA3, and CA4 may be arranged alongside at least one of the gate electrodes G1-G7 as extending in the first direction D1.

As an example, a pair of the first and fourth contacts CA1 and CA4 is interposed between a pair of the gate electrodes G1-G7. Referring back to FIGS. 18 and 19B, between the fourth and fifth gate electrodes G4 and G5, the first contact CA1 and the fourth contact CA4 may be arranged spaced apart from each other in the first direction D1. The first contact CA1 may contact two of the source/drain regions SD, and the fourth contact CA4 may contact one of the source/drain regions SD adjacent thereto. However, the inventive concept is not limited to this example; for example, the fourth contact CA4, along with the second contact CA2 or the third contact CA3, may be interposed between a pair of the gate electrodes G1-G7. Each of the fourth contacts CA4 may be shaped like a bar extending in the first direction D1 and may connect a plurality of the source/drain regions SD spaced apart from each other.

Each of the first to fourth contacts CA1, CA2, CA3, and CA4 may include the conductive pillar CP and the barrier layer BL covering side and bottom surfaces of the conductive pillar CP. As an example, the conductive pillar CP is formed of or includes tungsten, and the barrier layer BL is formed of or includes Ti/TiN.

As previously described with reference to FIGS. 2, 3A, 10, and 11, the first contact center line CL1 of each of the first contacts CA1 may be spaced apart from a corresponding one of the gate center lines GL by a first distance L1. The second contact center line CL2 of each of the second contacts CA2 may be spaced apart from a corresponding one of the gate center lines GL by a second distance L2. The third contact center line CL3 of each of the third contacts CA3 may be spaced apart from a corresponding one of the gate center lines GL by a third distance L3. In examples, the gate center line GL is equidistant from the fourth and fifth gate electrodes G4 and G5 and parallel to the first direction D1. Also, a fourth contact center line CL4 may extend along a center axis of the fourth contact CA4 and parallel to the first direction D1. Here, the fourth contact center line CL4 may be spaced apart from a corresponding one of the gate center lines GL by a fourth distance L4. As an example, the fourth distance L4 has a positive value, when measured along the second direction D2. In other words, the fourth contact CA4 may be closer to the fifth gate electrode G5 than to the fourth gate electrode G4 such that the ratio of a seventh separation distance (distance between the fourth contact CA4 and the fourth gate electrode G4) to an eighth separation distance (distance between the fourth contact CA4 and the fifth gate electrode G5) is greater than 1.

The fourth contacts CA4 may be formed at the same time, and in this case, all of them may have the same lateral offset, namely, the fourth distance L4, from their corresponding gate center lines GL. The first to fourth distances L1, L2, L3, and L4 may be different from each other. In other words, the sets of first to fourth contacts CA1, CA2, CA3, and CA4 may be laterally offset from the gate electrodes by different amounts from one another.

In another example, although not shown, the fourth contact CA4 is spaced apart from the fourth and fifth gate electrodes G4 and G5 by substantially the same distances, respectively.

Because the fourth contacts CA4 are formed at the same time, all of the fourth contacts CA4 may be formed to have the same ratio of the seventh separation distance to the eighth separation distance. The ratio for the fourth contacts CA4 (i.e., the ratio of the seventh separation distance to the eighth separation distance) may be different from the ratio (e.g., SL1/SL2) for the first contacts CAL the ratio (e.g., SL3/SL4) for the second contacts CA2, and the ratio (e.g., SL5/SL6) for the third contacts CA3.

Also, in the case where the fourth contacts CA4 are formed at the same time, the fourth contacts CA4 may have the same width (a fourth width). The width of the fourth contacts CA4 may be different from those of the first, second, and third contacts CA1, CA2, and CA3 (the first, second, and third widths W1, W2, and W3). In addition, the fourth contacts CA4 may be provided in such a way that bottom surfaces thereof are positioned at substantially the same level. Here, the bottom surfaces of the fourth contacts CA4 may be positioned at a different level from those of the first, second, and third contacts CA1, CA2, and CA3.

Figure 20:
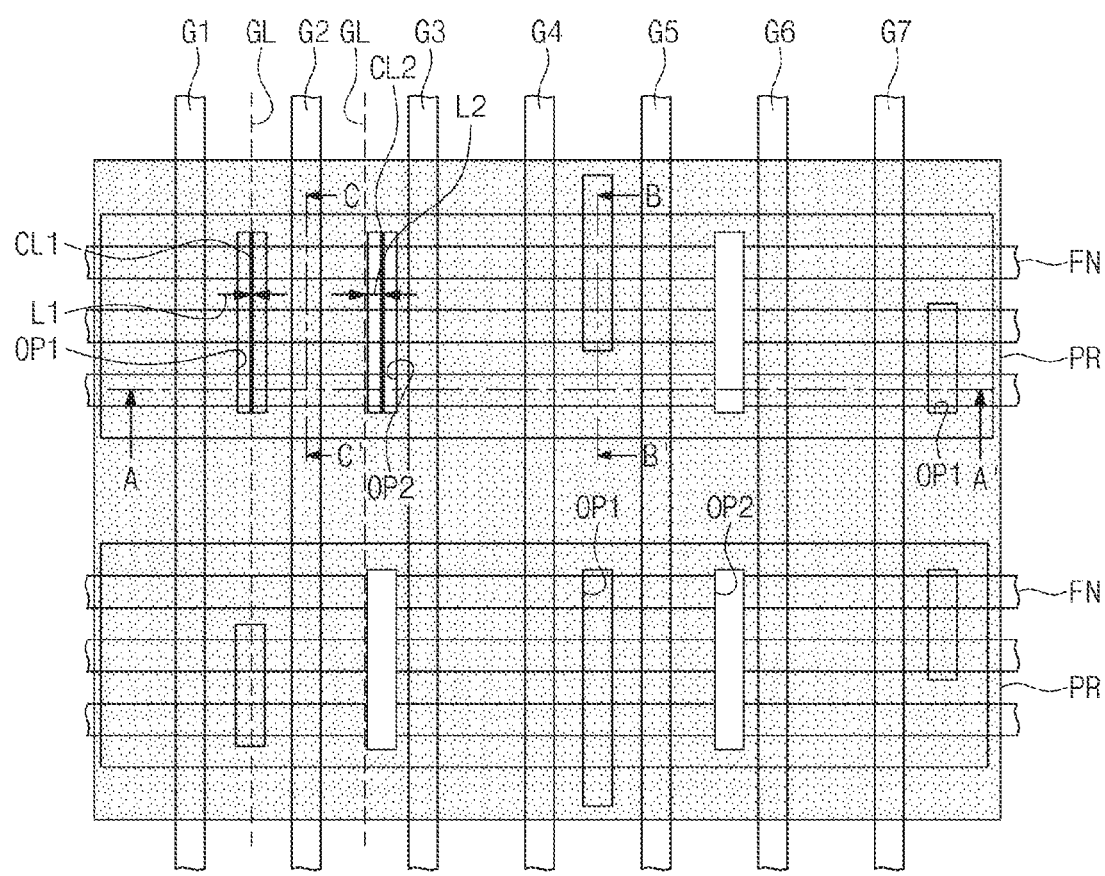
FIGS. 20, 22, and 24 are plan views illustrating still other examples of a method of fabricating a semiconductor device, according to the inventive concept.
Figure 21A:
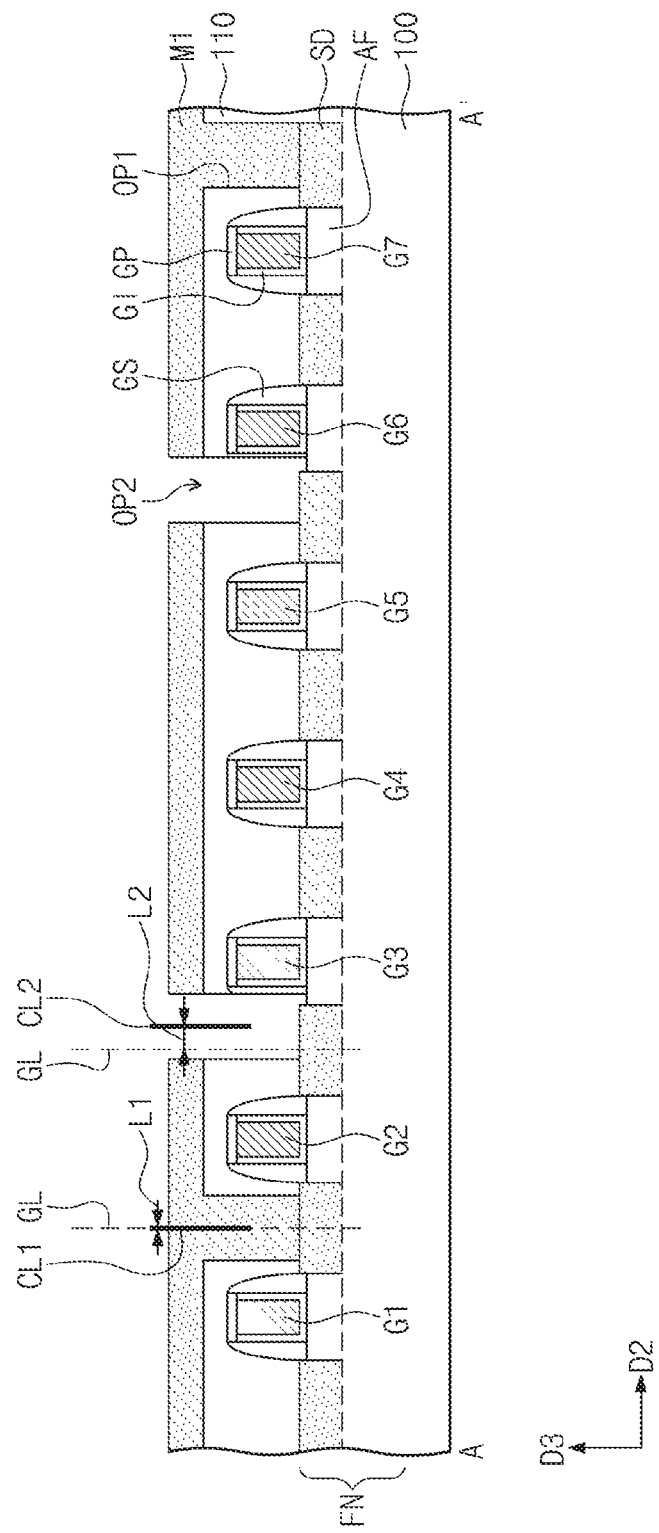
FIGS. 21A, 23A, and 25A are sectional views taken along lines A-A' of FIGS. 20, 22, and 24, respectively.
Figure 21B:
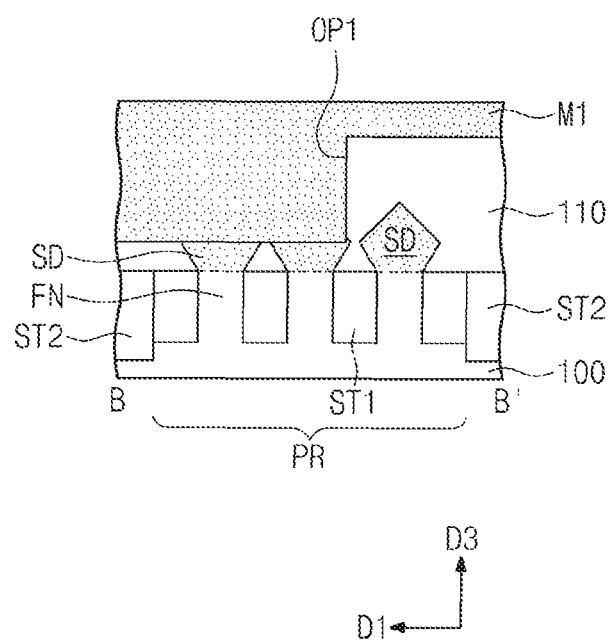
FIGS. 21B, 23B, and 25B are sectional views taken along lines B-B' of FIGS. 20, 22, and 24, respectively.
Figure 22:
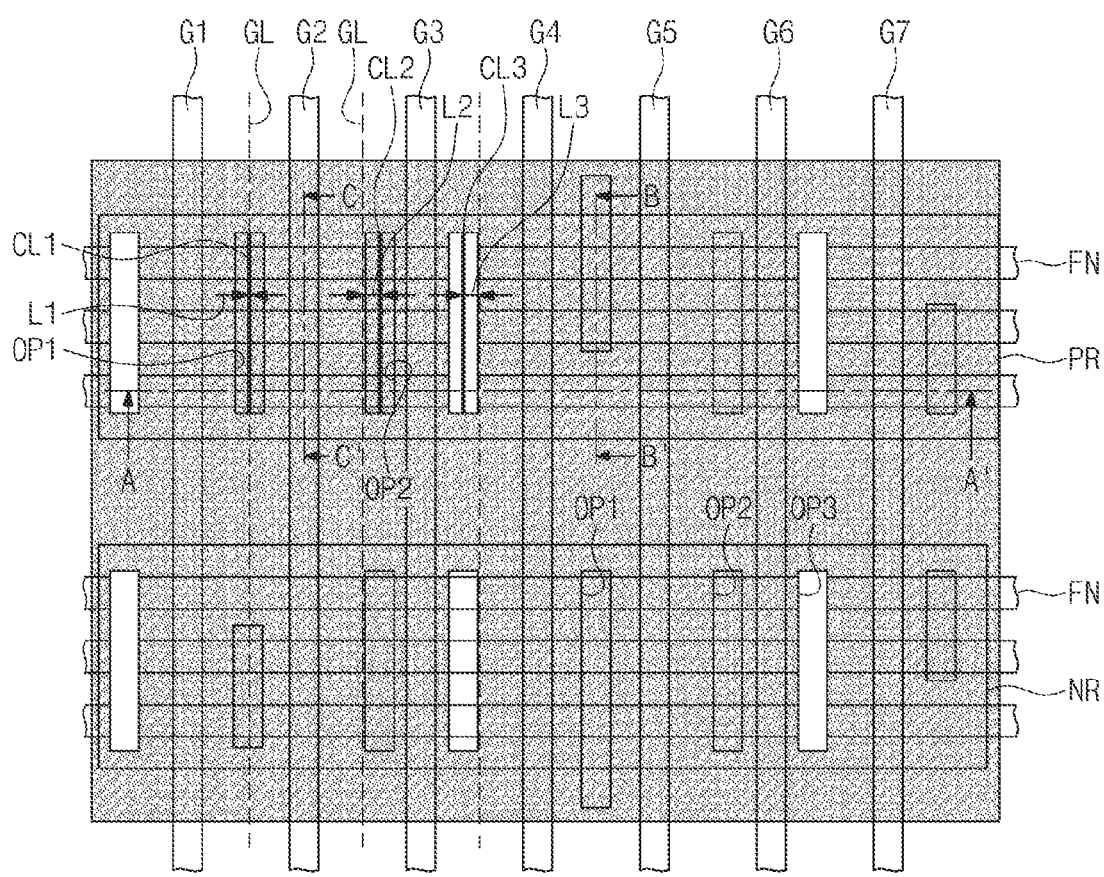
Figure 22:
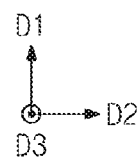
Figure 23A:
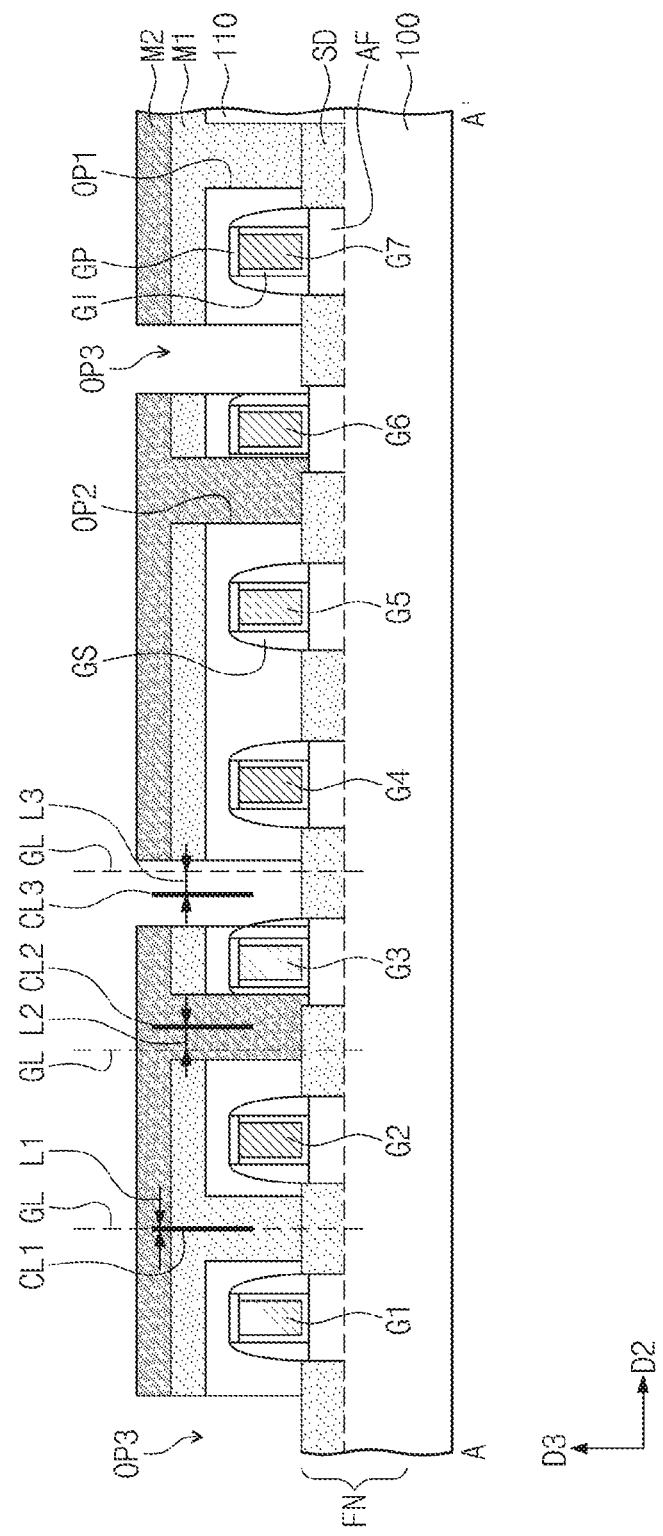
Figure 23B:
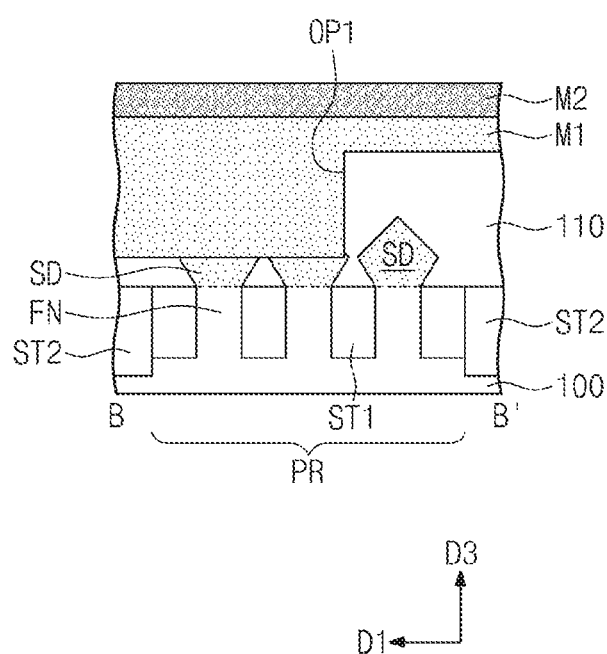
Figure 24:
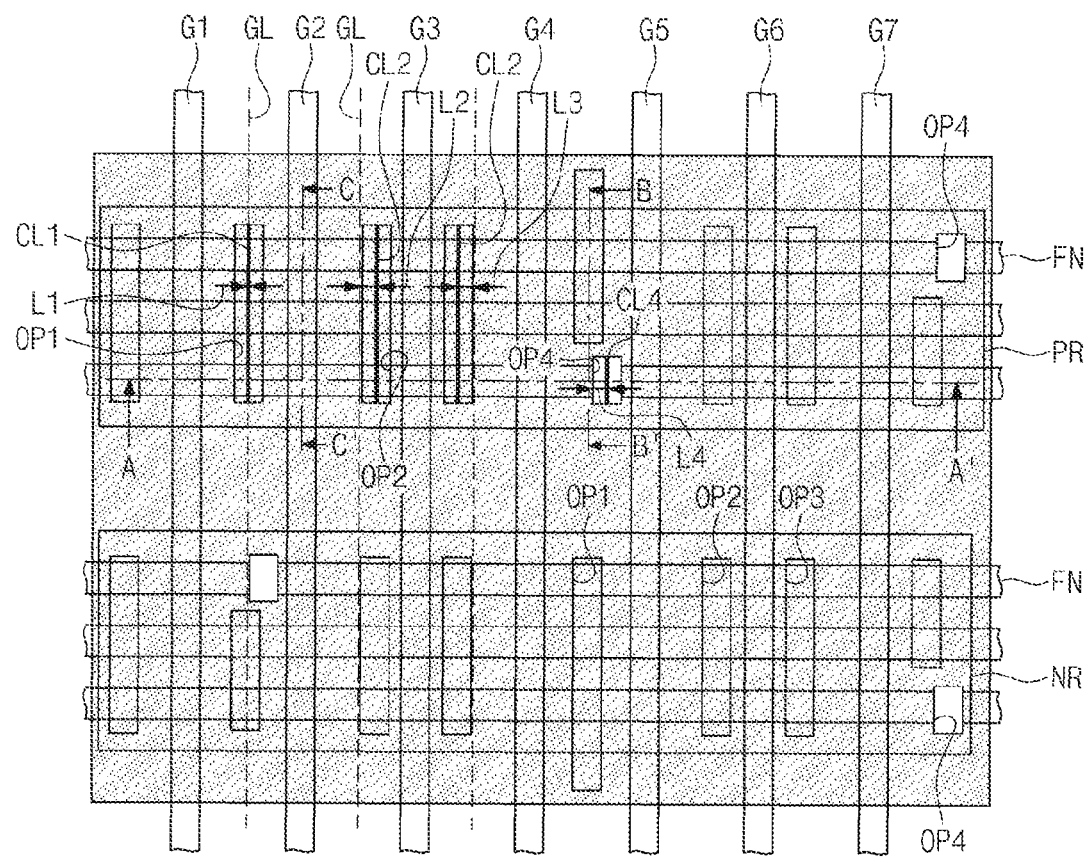
Figure 24:
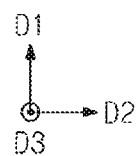
Figure 25A:
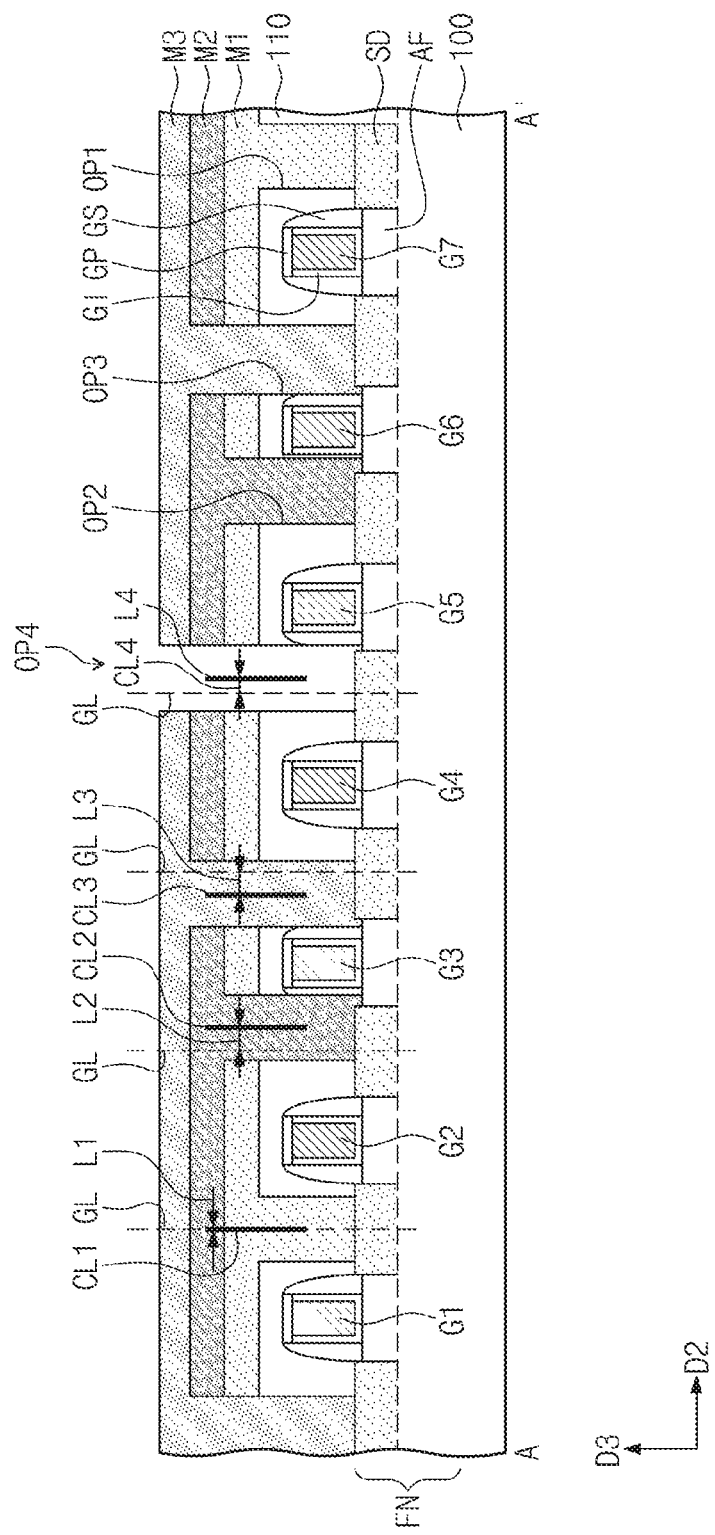
Figure 25B:
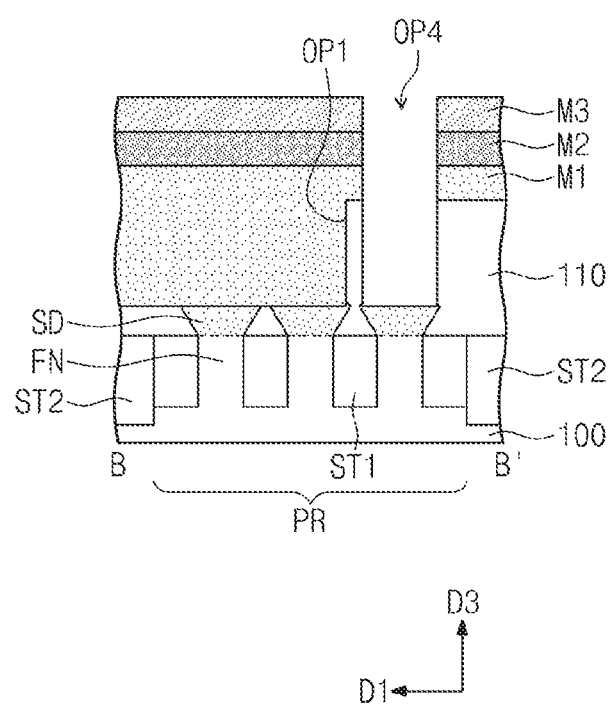

FIGS. 20, 22, and 24 are plan views illustrating still other examples of a method of fabricating a semiconductor device, according to the inventive concept. FIGS. 21A, 23A, and 25A are sectional views taken along lines A-A' of FIGS. 20, 22, and 24, respectively, and FIGS. 21B, 23B, and 25B are sectional views taken along lines B-B' of FIGS. 20, 22, and 24, respectively. In the following description, an element or step previously described with reference to FIGS. 12 through 17C may be identified by a similar or identical reference number so that another description thereof is unnecessary.

Referring to FIGS. 20, 21A, and 21B, a first mask layer M1 may be formed on the resulting structure of FIGS. 12, 13, FIGS. 6B and 6C to fill first contact holes OP1. Subsequently, a second photolithography process may be performed to form second contact holes OP2 penetrating the first mask layer M1 and first interlayer insulating layer 110. Referring back to FIG. 21B, the first contact hole OP1 between the fourth and fifth gate electrodes G4 and G5 may be formed to expose top surfaces of a pair of the source/drain regions SD, and the first mask layer M1 may be formed to cover the pair of the source/drain regions SD. One of the source/drain regions SD adjacent to the pair of the source/drain regions SD may be covered with the first interlayer insulating layer 110.

Referring to FIGS. 22, 23A, and 23B, a second mask layer M2 may be formed on the first mask layer M1 to fill the second contact holes OP2. Subsequently, a third photolithography process may be performed to form the third contact holes OP3 penetrating the second mask layer M2, the first mask layer M1, and the first interlayer insulating layer 110.

Referring to FIGS. 24, 25A, and 25B, a third mask layer M3 may be formed on the second mask layer M2 to fill the third contact holes OP3. The third mask layer M3 may be formed of or include a spin-on-hardmask (SOH) layer.

A fourth photolithography process may be performed to form fourth contact holes OP4 penetrating the third, second, and first mask layer M3, M2, and M1 and the first interlayer insulating layer 110. The fourth contact holes OP4 may be arranged along the second direction D2. The fourth contact holes OP4 may be spaced apart from each other with at least one of the gate electrodes G1-G7 interposed therebetween. Furthermore, the fourth contact holes OP4 may be arranged alongside at least one of the gate electrodes G1-G7 as extending in the first direction D1. As an example, the fourth contact hole OP4 may extend alongside the fourth and fifth gate electrodes G4 and G5 as extending and spaced apart from the first contact hole OP1 in the first direction D1. The fourth contact holes OP4 may be formed spaced apart from the first to third contact holes OP1, OP2, and OP3. In other words, the fourth contact holes OP4 may not be superimposed on the first to third contact holes OP1, OP2, and OP3.

The fourth photolithography process may include forming a photoresist layer on the third mask layer M3. A photoresist pattern may be formed from the photoresist layer by a patterning process (e.g., exposing and developing processes) using a fourth photomask. The photoresist pattern may be formed to have openings defining positions and shapes of the fourth contact holes OP4. Subsequently, the third, second, and first mask layers M3, M2, and M1 and the first interlayer insulating layer 110 exposed by the openings may be etched using the photoresist pattern as an etch mask to form the fourth contact holes OP4 penetrating the first interlayer insulating layer 110. Subsequently, the photoresist pattern may be removed. The fourth photomask may be different from the first to third photomasks for the first to third photolithography processes. In other words, the first to fourth photolithography processes may be separately performed.

The upper portions of the source/drain regions SD may be partially etched, during the etching of the first interlayer insulating layer 110. As an example, the fourth contact hole OP4 may be formed to expose one of the source/drain regions SD positioned between the fourth and fifth gate electrodes G4 and G5.

In some examples, the gate center line GL is equidistant from the fourth and fifth gate electrodes G4 and G5 and runs in the first direction D1. Also, the fourth contact center line CL4 may extend along the center axis of the fourth contact CA4 in the first direction D1. Here, the fourth contact center line CL4 may be spaced apart from a corresponding one of the gate center lines GL by the fourth distance L4. The fourth contact hole OP4 may be formed to be closer to the fifth gate electrode G5 than to the fourth gate electrode G4, and in this case, the fourth distance L4 may have a positive value, when measured along the second direction D2.

Because all of the fourth contact holes OP4 are formed by the fourth photolithography process, the fourth contact holes OP4 may be formed to have substantially the same lateral offset relative to the corresponding gate center lines GL (namely, the fourth distance L4). Here, the fourth distance L4 may be different from the first, second, and third distances L1, L2, and L3 (the lateral offsets of the first, second, and third contact holes OP1, OP2, and OP3). In other words, the sets of the first to fourth contact holes OP1, OP2, OP3, and OP4 may be offset relative to the gate electrodes G1-G7 by respective amounts different from each other.

Figure 26:
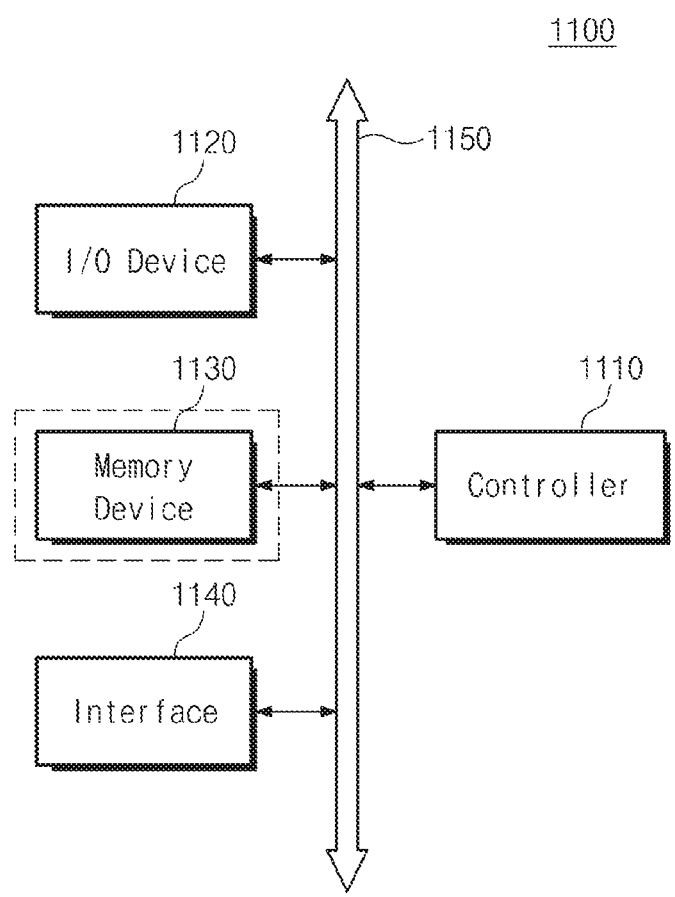
FIG. 26 is a block diagram illustrating an example of an electronic system including a semiconductor device according to the inventive concept.

FIG. 26 is a block diagram illustrating an example of an electronic system including a semiconductor device, according to the inventive concept.

Referring to FIG. 26, the electronic system 1100 may include a controller 1110, an input-output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 provides a path through which electrical signals are transmitted.

The controller 1110 may include at least one of a microprocessor, a digital signal processor, a microcontroller, or the like. The I/O unit 1120 may include a keypad, a keyboard, or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with the semiconductor device according to the inventive concept. It may be possible to omit the memory device 1130, depending on the purpose of the electronic system 1100 or type of electronic product employing the electronic system 1100. The interface unit 1140 may transmit electrical data to a communication network or may receive electrical data from a communication network. The interface unit 1140 may operate in a wireless or wired manner. For example, the interface unit 1140 may include an antenna for wireless communication or a transceiver for wired and/or wireless communication. A semiconductor device according to the inventive concept may be provided as a part of the controller 1110 or the I/O unit 1120. Although not shown in the drawings, the electronic system 1100 may further include a fast DRAM device and/or a fast SRAM device that acts as a cache memory for improving an operation of the controller 1110.

Figure 27:
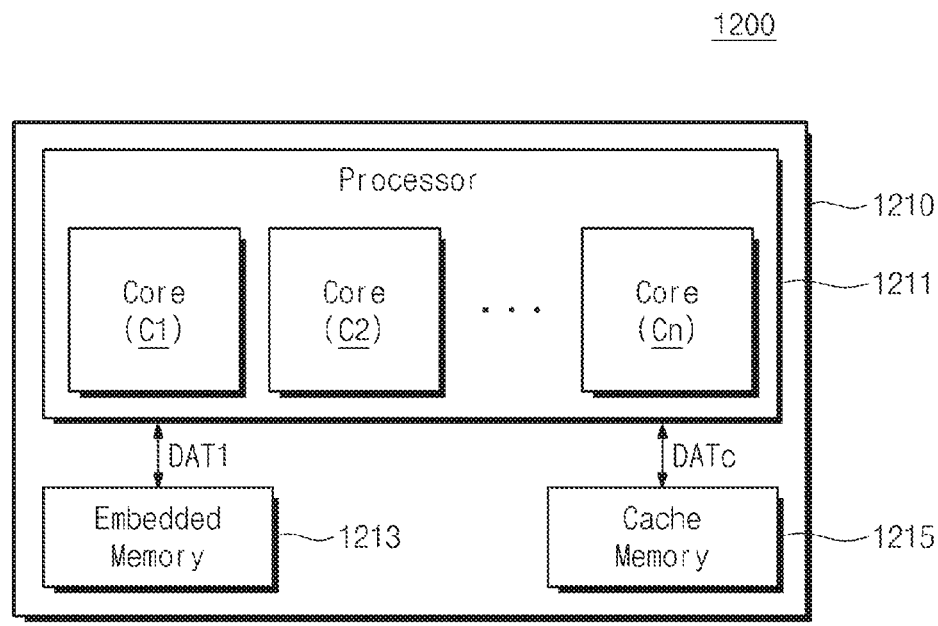
FIG. 27 is a block diagram illustrating an example of an electronic device including a semiconductor device according to the inventive concept.

FIG. 27 is a block diagram illustrating an example of an electronic device including a semiconductor device, according to the inventive concept.

Referring to FIG. 27, the electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may include a semiconductor device according to the inventive concept (for example, the plurality of logic cells described with reference to FIG. 1).

The electronic device 1200 may be configured to perform its own functions using the processed data and signals. As an example, the processor 1211 may be an application processor.

The embedded memory 1213 may exchange first data DAT1 with the processor 1211. The first data DAT1 may be data processed, or to be processed, by the one or more processor cores C1-Cn. The embedded memory 1213 may manage the first data DAT1. For example, the embedded memory 1213 may be used for a buffering operation on first data DAT1. In other words, the embedded memory 1213 may be operated as a buffer memory or a working memory for the processor 1211.

In examples, the electronic device 1200 is used to realize a wearable electronic device. In general, a wearable electronic device is configured to process relatively small amounts of data. In this sense, i.e., in the case where the electronic device 1200 constitutes a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it is possible for the electronic device 1200 to be small and operate at a high speed. Furthermore, in the case where the SRAM is embedded in the semiconductor chip 1210, it is possible to minimize the power actively consumed by the electronic device 1200. As an example, the SRAM may include at least one of the semiconductor devices according to the inventive concept.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may have a relatively small capacity and operate at a very high speed. In examples, the cache memory 1215 includes an SRAM device including a semiconductor device according to the inventive concept. In the case where the cache memory 1215 is used, it is possible to minimize an access frequency or an access time to the embedded memory 1213 performed by the processor 1211. In other words, the use of the cache memory 1215 may allow the electronic device 1200 to have a fast operating speed.

To provide better understanding of the inventive concept, the cache memory 1215 is illustrated in FIG. 27 to be a component separate from the processor 1211. However, the cache memory 1215 may constitute the processor 1211. That is, the configuration of an electronic device according to the inventive concept is not limited to that illustrated by FIG. 27.

The processor 1211, the embedded memory 1213, and the cache memory 1215 may be configured to exchange or transmit data, based on at least one of various interface protocols. For example, the processor 1211, the embedded memory 1213, and the cache memory 1215 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), or Universal Flash Storage (UFS) protocols.

Figure 28:
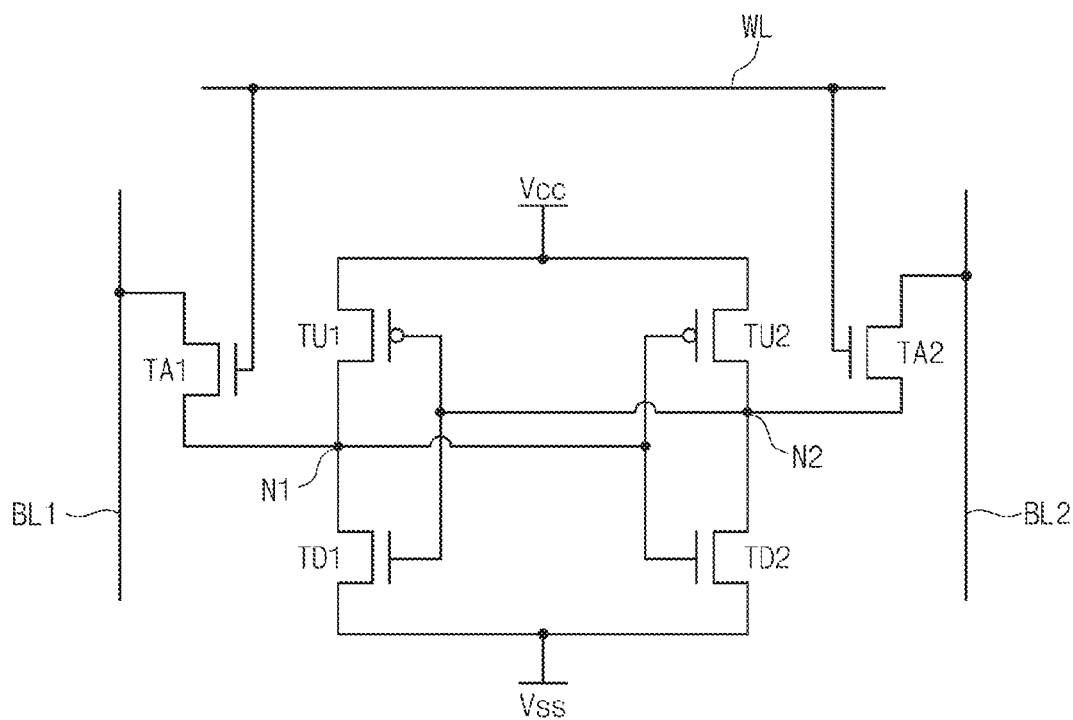
FIG. 28 is an equivalent circuit diagram illustrating an example of an SRAM cell according to the inventive concept.

FIG. 28 is an equivalent circuit diagram illustrating one example of an SRAM cell according to the inventive concept. The SRAM cell may comprise at least one semiconductor device according to the inventive concept. The SRAM cell may be used for the embedded memory 1213 and/or the cache memory 1215 of FIG. 27.

Referring to FIG. 28, the SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors, whereas the first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line Vcc, and a second source/drain of the first pull-down transistor TD1 may be connected to a ground line Vss. A gate of the first pull-up transistor TU1 and a gate of the first pull-down transistor TD1 may be electrically connected to each other. Accordingly, the first pull-up transistor TU1 and the first pull-down transistor TD1 may constitute a first inverter. The mutually-connected gates of the first pull-up transistor TU1 and the first pull-down transistor TD1 may serve as an input terminal of the first inverter, and the first node N1 may serve as an output terminal of the first inverter.

A first source/drain of the second pull-up transistor TU2 and a first source/drain of the second pull-down transistor TD2 may be connected to the second node N2. A second source/drain of the second pull-up transistor TU2 may be connected to the power line Vcc, and a second source/drain of the second pull-down transistor TD2 may be connected to the ground line Vss. A gate of the second pull-up transistor TU2 and a gate of the second pull-down transistor TD2 may be electrically connected to each other. Accordingly, the second pull-up transistor TU2 and the second pull-down transistor TD2 may constitute a second inverter. The mutually-connected gates of the second pull-up transistor TU2 and the second pull-down transistor TD2 may serve as an input terminal of the second inverter, and the second node N2 may serve as an output terminal of the second inverter.

The first and second inverters may be coupled with each other to form a latch structure. In other words, the gates of the first pull-up transistor TU1 and the first pull-down transistor TD1 may be electrically connected to the second node N2, and the gates of the second pull-up and second pull-down transistors TU2 and TD2 may be electrically connected to the first node N1. The first source/drain of the first access transistor TA1 may be connected to the first node N1, and the second source/drain of the first access transistor TA1 may be connected to a first bit line BL1. The first source/drain of the second access transistor TA2 may be connected to the second node N2, and the second source/drain of the second access transistor TA2 may be connected to a second bit line BL2. The gates of the first and second access transistors TA1 and TA2 may be electrically coupled to a word line WL.

Figure 29:
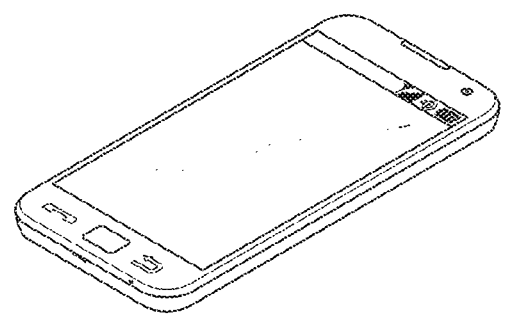
FIGS. 29, 30 and 31 are diagrams illustrating examples of a multimedia device including a semiconductor device according to the inventive concept.
Figure 30:
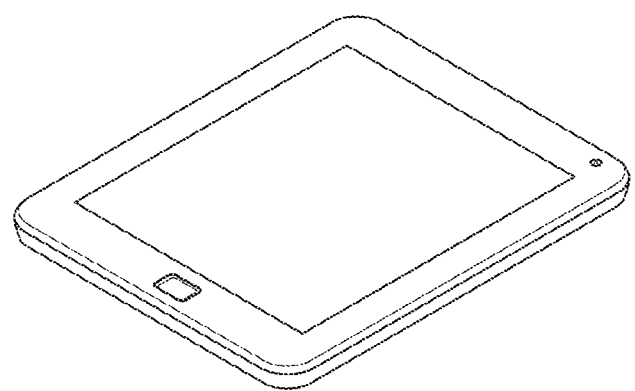
Figure 31:
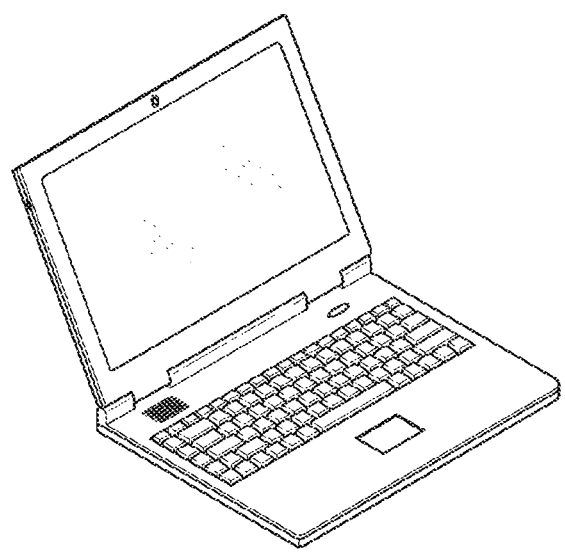

FIGS. 29 through 31 are diagrams illustrating some examples of multimedia devices having an electronic device and/or system including a semiconductor device according to the inventive concept. An electronic system, such as that shown in and described with reference to FIG. 26, and/or an electronic device, such as that shown in and described with reference to FIG. 27, may be employed by a mobile or smart phone 2000 shown in FIG. 29, by a tablet or smart tablet PC 3000 shown in FIG. 30, or by a laptop computer 4000 shown in FIG. 31.

According to one aspect of the inventive concept, a semiconductor device may include first and second contacts, which are arranged between but laterally offset differently with respect gate electrodes. Thus, it is possible to maximize a process margin between the gate electrodes and the contacts. Furthermore, the offsetting of the contact provided on a PMOS region makes it possible to more effectively apply a compressive stress to a channel region.

Although examples of the inventive concepts have been particularly shown and described, it will be understood by one of ordinary skill in the art that variations in form and detail may be made to these examples without departing from the spirit and scope of the inventive concept as set out in the attached claims.

What is claimed is:

1. A semiconductor device, comprising:
a substrate having active patterns and source/drain regions in upper portions of the active patterns;
gate electrodes crossing the active patterns in a first direction, the gate electrodes being spaced from each other in a second direction perpendicular to the first direction; and
a set of first contacts and a set of second contacts, the first and second contacts being electrically connected to the source/drain regions, respectively,
wherein the source/drain regions and the first and second contacts connected thereto are located between the gate electrodes as viewed in plan,
the set of second contacts are offset, in the second direction, relative the gate electrodes by an amount different from that by which the set of first contacts are offset relative to the gate electrodes in the second direction, and
bottom surfaces of the first contacts are disposed at a different level in the device from bottom surfaces of the second contacts.

2. The device of claim 1, wherein respective ones of the source/drain regions have first recesses in upper portions thereof, respectively, and respective others of the source/drain regions have second recesses in upper portions thereof, respectively,
bottoms of the first recesses are located at a different level in the device from bottoms of the second recesses, and
the first contacts have lower portions disposed in the first recesses, respectively, and the second contacts have lower portions disposed in the second recesses, respectively.

3. The device of claim 1, further comprising a set of third contacts, the third contacts being provided between the gate electrodes and electrically connected to the source/drain regions,
the set of third contacts are offset, in the second direction, relative the gate electrodes by an amount different from each of those by which the set of first contacts and the set of second contacts are offset relative to the gate electrodes in the second direction.

4. The A semiconductor device, comprising:
a substrate having at least one active pattern and source/drain regions at upper portions of each said at least one active pattern;
gate electrodes extending longitudinally in a first direction parallel to a top surface of the substrate and crossing the at least one active pattern;
at least one first contact electrically connected to a respective one of the source/drain regions;
a set of second contacts each electrically connected to a respective one of the source/drain regions, and
wherein the gate electrodes are uniformly spaced from each other in a second direction parallel to the top surface of the substrate and perpendicular to the first direction,
the source/drain regions are interposed between the gate electrodes as viewed in plan,
each said at least one of the first contacts is interposed between adjacent gate electrodes of a respective pair of the gate electrodes,
each of the second contacts is interposed between adjacent gate electrodes of a respective pair of the gate electrodes,
the set of second contacts is offset, in the second direction, relative the gate electrodes by an amount different from that by which the at least one first contact is offset relative to the gate electrodes in the second direction,
each said at least one first contact is disposed midway between the adjacent gate electrodes of the respective pair of gate electrodes between which the first contact is interposed,
each of the second contacts is located closer to one of the adjacent gate electrodes than the other of the adjacent gate electrodes of the respective pair of gate electrodes between which the second contact is interposed,
the gate electrodes comprise gates of transistors and dummy gates that are electrically isolated in the device so as to be electrically inactive in the device, and
each said one of the adjacent gate electrodes, located closer to one of the second contacts than the said other of the gate electrodes, comprises a respective one of said dummy gates.

5. The device of claim 4, wherein the substrate has active patterns arrayed in the first direction, and
when viewed in plan, at least one of the first and second contacts has the shape of a bar extending lengthwise in the first direction and overlaps at least two of the source/drain regions spaced apart from each other in the first direction.

6. The device of claim 4, wherein the first contact has a width, in the second direction, different from that of each of the second contacts.

7. The device of claim 6, wherein the source/drain regions have recesses in upper portions thereof, respectively, and
each of the first and second contacts has a lower portion extending into a respective one of the recesses.

8. The device of claim 4, wherein the source/drain regions have recesses in upper portions thereof, respectively, and
each of the first and second contacts has a lower portion extending into a respective one of the recesses.

9. The device of claim 4, wherein a bottom surface of the first contact is disposed at a different level in the device from bottom surfaces of the second contacts.

10. The device of claim 4, wherein a respective one of the source/drain regions has a first recess in an upper portion thereof, and respective others of the source/drain regions have second recesses in upper portions thereof, respectively,
a bottom of the first recess is located at a different level in the device from bottoms of the second recesses, and
the first contact has a lower portion disposed in the first recess, and the second contacts have lower portions disposed in the second recesses, respectively.

11. The device of claim 4, wherein the at least one first contact comprises a set of first contacts,
the source/drain regions and the first contacts connected thereto are located between the gate electrodes as viewed in plan, and
the set of second contacts is offset, in the second direction, relative the gate electrodes by an amount different from that by which the set of first contacts is offset relative to the gate electrodes in the second direction.

12. A semiconductor device, comprising:
a substrate having at least one active pattern and source/drain regions at upper portions of each said at least one active pattern;
gate electrodes extending longitudinally in a first direction parallel to a top surface of the substrate and crossing the at least one active pattern;
at least one first contact electrically connected to a respective one of the source/drain regions;
a set of second contacts each electrically connected to a respective one of the source/drain regions, and
wherein the gate electrodes are uniformly spaced from each other in a second direction parallel to the top surface of the substrate and perpendicular to the first direction,
the source/drain regions are interposed between the gate electrodes as viewed in plan,
each said at least one of the first contacts is interposed between adjacent gate electrodes of a respective pair of the gate electrodes,
each of the second contacts is interposed between adjacent gate electrodes of a respective pair of the gate electrodes,
the set of second contacts is offset, in the second direction, relative the gate electrodes by an amount different from that by which the at least one first contact is offset relative to the gate electrodes in the second direction,
the entirety of each said at least one first contact is disposed on the source/drain region to which the first contact is electrically connected, and
one part of each of the second contacts is disposed on the source/drain region to which the second contact is electrically connected, and another part of each of the second contacts is disposed on a channel region interposed between respective ones of the source/drain regions.

13. The device of claim 12, wherein the substrate has active patterns arrayed in the first direction, and
when viewed in plan, at least one of the first and second contacts has the shape of a bar extending lengthwise in the first direction and overlaps at least two of the source/drain regions spaced apart from each other in the first direction.

14. The device of claim 12, wherein the first contact has a width, in the second direction, different from that of each of the second contacts.

15. The device of claim 14, wherein the source/drain regions have recesses in upper portions thereof, respectively, and
each of the first and second contacts has a lower portion extending into a respective one of the recesses.

16. The device of claim 12, wherein the source/drain regions have recesses in upper portions thereof, respectively, and each of the first and second contacts has a lower portion extending into a respective one of the recesses.

17. The device of claim 12, wherein a bottom surface of the first contact is disposed at a different level in the device from bottom surfaces of the second contacts.

18. The device of claim 12, wherein a respective one of the source/drain regions has a first recess in an upper portion thereof, and respective others of the source/drain regions have second recesses in upper portions thereof, respectively, a bottom of the first recess is located at a different level in the device from bottoms of the second recesses, and the first contact has a lower portion disposed in the first recess, and the second contacts have lower portions disposed in the second recesses, respectively.

19. The device of claim 12, wherein the at least one first contact comprises a set of first contacts, the source/drain regions and the first contacts connected thereto are located between the gate electrodes as viewed in plan, and the set of second contacts is offset, in the second direction, relative the gate electrodes by an amount different from that by which the set of first contacts is offset relative to the gate electrodes in the second direction.

\* \* \* \* \*